(12) United States Patent
Wang et al.

(10) Patent No.: US 12,369,466 B2
(45) Date of Patent: Jul. 22, 2025

(54) DRIVE SUBSTRATE, LIGHT-EMITTING PANEL AND DISPLAY DEVICE

(71) Applicant: Shanghai Tianma Microelectronics Co., Ltd., Shanghai (CN)

(72) Inventors: Lihua Wang, Shanghai (CN); Tingting Li, Shanghai (CN); Pengfei Qiu, Shanghai (CN); Shumian Xu, Shanghai (CN); Peng Gui, Shanghai (CN); Jiayin Tang, Shanghai (CN); Yimiao Ding, Shanghai (CN); Shengchao Ji, Shanghai (CN)

(73) Assignee: SHANGHAI TIANMA MICROELECTRONICS CO., LTD., Shanghai (CN)

( * ) Notice: Subject to any disclaimer, the term of this patent is extended or adjusted under 35 U.S.C. 154(b) by 632 days.

(21) Appl. No.: 17/724,513

(22) Filed: Apr. 20, 2022

(65) Prior Publication Data
US 2023/0269976 A1 Aug. 24, 2023

(30) Foreign Application Priority Data
Feb. 22, 2022 (CN) .......................... 202210159360.0

(51) Int. Cl.
H10K 59/131 (2023.01)
H10D 89/60 (2025.01)
H10K 59/121 (2023.01)

(52) U.S. Cl.
CPC ........... *H10K 59/131* (2023.02); *H10D 89/60* (2025.01); *H10K 59/121* (2023.02)

(58) Field of Classification Search
CPC ..... H10K 59/131; H10K 59/121; H10D 89/60
(Continued)

(56) References Cited

U.S. PATENT DOCUMENTS

2007/0008268 A1* 1/2007 Park ..................... G11C 19/28
345/92
2011/0157532 A1 6/2011 Nakagawa
(Continued)

FOREIGN PATENT DOCUMENTS

CN 100507687 C 7/2009
CN 102473367 A 5/2012
(Continued)

OTHER PUBLICATIONS

The First Office Action for Chinese Application No. 202210159360.0, dated Apr. 1, 2022, 9 pages.

*Primary Examiner* — Jami Valentine Miller
(74) *Attorney, Agent, or Firm* — East IP P.C.

(57) ABSTRACT

The application relates to a drive substrate, light-emitting panel and display device. The drive substrate is configured to drive a light-emitting element. The drive substrate includes a light-emitting area and a frame area surrounding at least a part of the light-emitting area. The drive substrate includes a substrate; and a device layer disposed on the substrate, the device layer including a pixel drive circuit disposed in the light-emitting area, and an electrostatic discharge circuit, a first signal line and a second signal line disposed in the frame area, the first signal line being electrically connected to at least one of the pixel drive circuit and the light-emitting element, and the second signal line being electrically connected to the electrostatic discharge circuit; wherein the second signal line is disposed on a side of the first signal line away from the light-emitting area and is spaced from the first signal line.

18 Claims, 14 Drawing Sheets

(58) Field of Classification Search
USPC .......................................................... 257/237
See application file for complete search history.

(56) References Cited

U.S. PATENT DOCUMENTS

| | | | | |
|---|---|---|---|---|
| 2017/0372113 | A1* | 12/2017 | Zhang | H10K 50/86 |
| 2018/0019288 | A1* | 1/2018 | Yang | H10K 59/65 |
| 2022/0121057 | A1* | 4/2022 | Wang | G02F 1/1345 |
| 2022/0190200 | A1* | 6/2022 | Yu | G06F 3/044 |
| 2022/0320236 | A1* | 10/2022 | Dai | H10K 59/873 |
| 2022/0327994 | A1* | 10/2022 | Sun | G09G 3/32 |
| 2024/0178198 | A1* | 5/2024 | Ji | H10H 20/855 |

FOREIGN PATENT DOCUMENTS

| | | |
|---|---|---|
| CN | 109148522 A | 1/2019 |
| CN | 112114449 A | 12/2020 |
| CN | 112114701 A | 12/2020 |
| CN | 112197689 A | 1/2021 |
| CN | 112599576 A | 4/2021 |
| CN | 112602198 A | 4/2021 |
| CN | 113871445 A | 12/2021 |
| WO | 2021212421 A1 | 10/2021 |

* cited by examiner

DRIVE SUBSTRATE, LIGHT-EMITTING PANEL AND DISPLAY DEVICE

CROSS-REFERENCE TO RELATED APPLICATIONS

The present application claims the priority to Chinese patent application No. 202210159360.0, entitled "DRIVE SUBSTRATE, LIGHT-EMITTING PANEL AND DISPLAY DEVICE" and filed on Feb. 22, 2022, which is incorporated herein by reference in its entirety.

TECHNICAL FIELD

The present application relates to the field of display technology, and particularly to a drive substrate, light-emitting panel and display device.

BACKGROUND

Light-emitting elements, such as Organic Light-emitting Diodes (OLEDs), mini light-emitting diodes (mini LEDs), and micro light-emitting diodes (micro LEDs), are widely used in the fields of illumination and display technology.

There is a need to provide a drive substrate for controlling a light-emitting element, in order to drive the light-emitting element to emit light in a better way to realize illumination or display. The existing drive substrate has defects in the structural design, leading to a large overlap area between a signal line for electrical connection with a pixel drive circuit and a signal line for connection with an electrostatic discharge circuit in a frame area. As a result, the existing drive substrate is prone to electrochemistry corrosion, which affects the safety performance of the drive substrate.

SUMMARY

The present application provides a drive substrate, light-emitting panel and display device. The drive substrate is not prone to electrochemical corrosion and has a high safety performance.

In an aspect, according to an embodiment of the present application, a drive substrate for driving a light-emitting element is proposed. The drive substrate includes a light-emitting area and a frame area surrounding at least a part of the light-emitting area. The drive substrate includes a substrate; and a device layer disposed on the substrate, the device layer including a pixel drive circuit disposed in the light-emitting area, and an electrostatic discharge circuit, a first signal line and a second signal line disposed in the frame area, the first signal line being electrically connected to at least one of the pixel drive circuit and the light-emitting element, and the second signal line being electrically connected to the electrostatic discharge circuit, wherein the second signal line is disposed on a side of the first signal line away from the light-emitting area and is spaced from the first signal line.

In another aspect, according to an embodiment of the present application, a light-emitting panel is proposed. The light-emitting panel includes the drive substrate as described above; and a light-emitting layer, stacked on a side of the device layer away from the substrate and located in the light-emitting area, the light-emitting layer including light-emitting elements distributed in an array and electrically connected to the pixel drive circuit and the first signal line.

In another aspect, according to an embodiment of the present application, a display device is proposed. The display device includes the light-emitting panel as described above.

According to the drive substrate, the light-emitting panel and the display device provided by embodiments of the present application, the drive substrate includes the substrate and the device layer disposed on the substrate. The device layer includes the pixel drive circuit disposed in the light-emitting area, and the electrostatic discharge circuit, first signal line and second signal line disposed in the frame area. Since the first signal line is electrically connected to at least one of the pixel drive circuit and the light-emitting element and the second signal line is electrically connected to the electrostatic discharge circuit, and meanwhile, the second signal line is disposed on the side of the first signal line away from the light-emitting area and is spaced from the first signal line, the first signal line can be introduced into the light-emitting area directly from the frame area and electrically connected to the pixel drive circuit and the light-emitting element.

BRIEF DESCRIPTION OF THE DRAWINGS

Features, advantages, and technical effects of exemplary embodiments of the present application will be described below with reference to the accompany drawings.

In the drawings.

Figure 1:
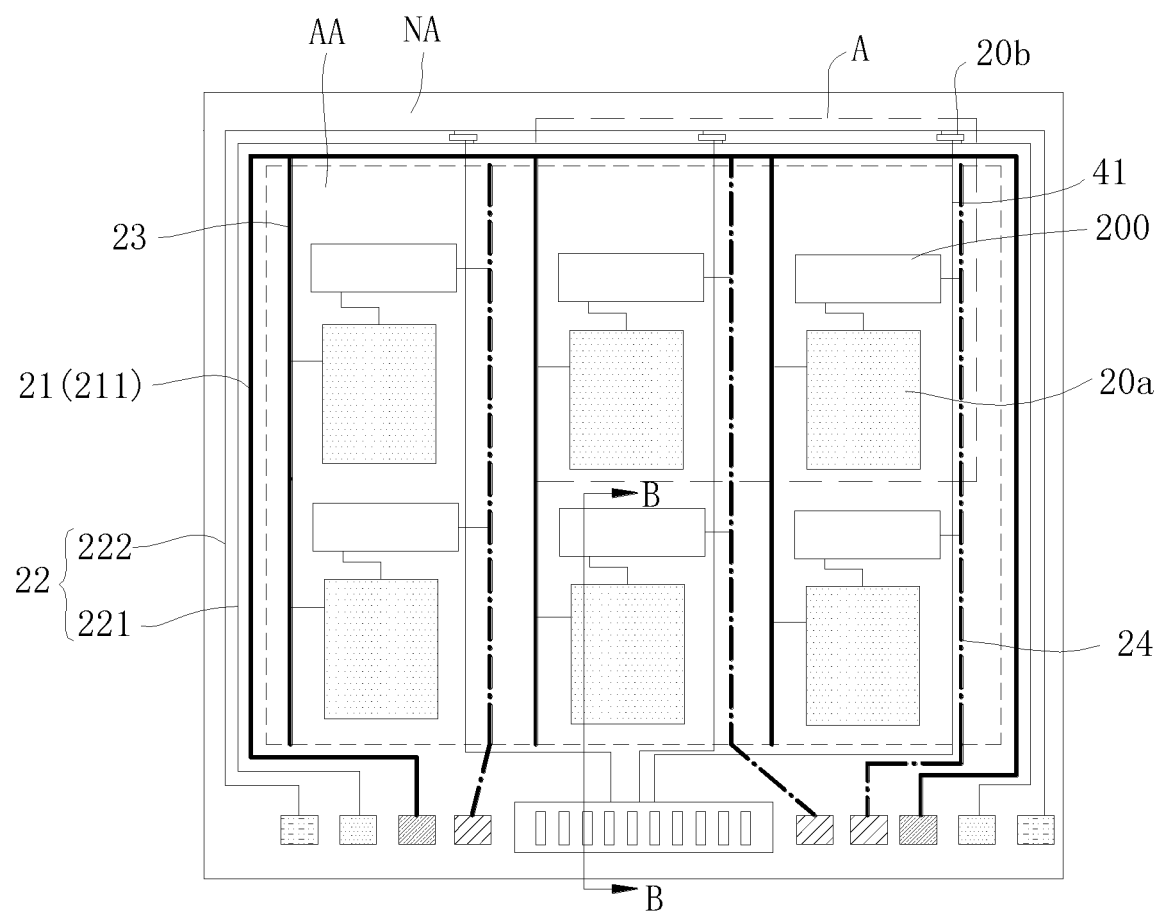
FIG. 1 is a schematic top view of a drive substrate of an embodiment of the present application.

100-drive substrate; AA-light-emitting area; NA-frame area; NA1-upper frame area; NA2-first side frame area; NA3-second side frame area;
10-substrate;
20-device layer; 20a-pixel drive circuit; 20b-electrostatic discharge circuit;
21-first signal line; 211-first sub-signal line; 212-second sub-signal line;
22-second signal line; 221-third sub-signal line; 222-fourth sub-signal line;
23-first signal transfer line; 24-second signal transfer line; 241-second connection segment; 242-second transfer segment; 243-first hollow hole;
25-first jumper line; 251-second hollow hole; 26-second jumper line; 261-third hollow hole;
27-seperation line; 28-reference signal line;
41-data line; 42-scan line;
31-first connection terminal; 32-second connection terminal; 33-third connection terminal; 34-fourth connection terminal; 35-fifth connection terminal;
201-metal layer; 202-insulation layer;
200-light-emitting element;
300-drive chip;
400-flexible circuit board;
aa-first line segment; bb-second line segment; cc-third line segment;
X-first direction; Y-second direction; Z-thickness direction.

In the drawings, the same parts are given the same reference numerals. The drawings are not drawn to actual scales.

DETAILED DESCRIPTION

Features and exemplary embodiments of various aspects of the present application will be described in details below. In order to make the objects, technical solutions and advantages of the present application clearer, the present application is further described in details below with reference to the drawings and specific embodiments. It should be understood that, the specific embodiments described herein are provided simply for illustrating the present application, and not for limiting the present application. It is apparent for those skilled in the art that the present application can be implemented without some of those specific details. The following description of embodiments is only for providing a better understanding of the present application by showing examples of the present application.

It should be noted that, relational terms, such as first, second, and the like, are used herein merely to distinguish one entity or operation from another entity or operation, without necessity to require or imply any actual such relationship or order between these entities or operations.

It should be understood that, when a structure of a part is described, a layer or region described as "on" or "over" another layer or region, may be directly on the other layer or region, or there may be other layer(s) or region(s) included between the layer or region and the other layer or region. Further, if the part is turned over, the layer or region will be "below" or "under" the other layer or region.

Light-emitting elements, such as Organic Light-emitting Diodes (OLEDs), mini light-emitting diodes (mini LEDs), and micro light-emitting diodes (micro LEDs), are widely used in the fields of illumination and display technology.

There is a need to provide a drive substrate for controlling a light-emitting element, in order to drive the light-emitting element to emit light in a better way to realize illumination or display. When the drive substrate is operating, there is a need to provide a signal line for electrical connection with a pixel drive circuit and a signal line for connection with an electrostatic discharge circuit in a frame area of the drive substrate. In the existing drive substrate, the signal line for electrical connection with the pixel drive circuit is located on the periphery of the signal line for connection with the electrostatic discharge circuit. Since the pixel drive circuit is disposed in a light-emitting area of the drive substrate, the signal line for electrical connection with the pixel drive circuit, when introduced into the light-emitting area to electrically connected to the pixel drive circuit, will be bridged and overlap with the signal line for connection with the electrostatic discharge circuit. As a result, when the drive substrate is operating, if there is a potential difference between the overlapping signal lines, electrochemical corrosion is easily formed under an action of an external environment of high temperature and high humidity, causing short-circuit due to corrosion of the metal forming the signal lines, which affects the safety performance of the drive substrate.

In order to solve the above technical problem, an embodiment of the present application provides a drive substrate that is not prone to electrochemical corrosion and has high safety performance.

Figure 2:
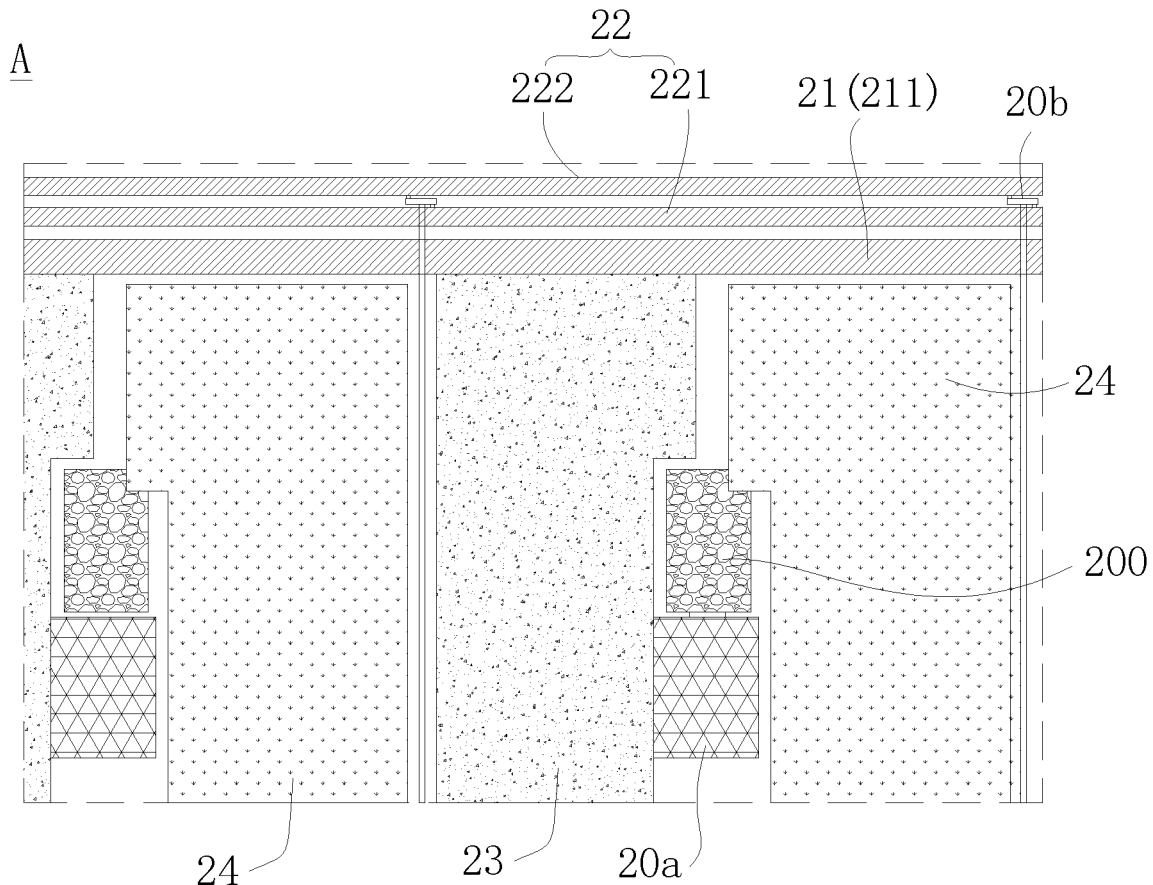
FIG. 2 is a schematic enlarged view of a region A in FIG. 1.
Figure 3:
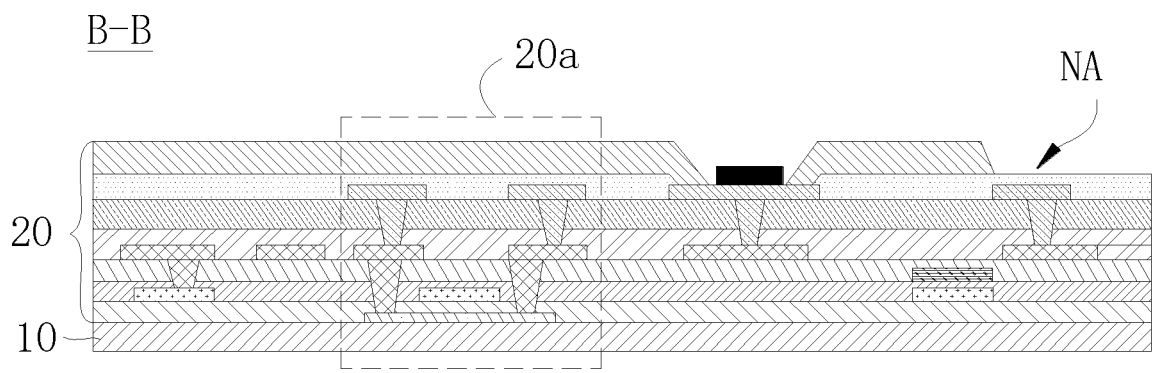
FIG. 3 is a sectional view along a B-B direction in FIG. 1.

As shown in FIG. 1-3, according to an embodiment of the present application, a drive substrate 100 is proposed. The drive substrate 100 may be configured to drive a light-emitting element 200. The drive substrate 100 may include a light-emitting area AA and a frame area NA surrounding at least a part of the light-emitting area AA. The drive substrate 100 includes a substrate 10 and a device layer 20 disposed on the substrate 10. The device layer 20 includes a pixel drive circuit 20a disposed in the light-emitting area AA, and an electrostatic discharge circuit 20b, a first signal line 21 and a second signal line 22 disposed in the frame area NA. The first signal line 21 is electrically connected to at least one of the pixel drive circuit 20a and the light-emitting element 200, and the second signal line 22 is electrically connected to the electrostatic discharge circuit 20b. The second signal line is disposed on a side of the first signal line 21 away from the light-emitting area AA and is spaced from the first signal line 21.

Optionally, the frame area NA may be disposed to completely surround the light-emitting area AA, and of course, it may also be disposed to partially surround the light-emitting area AA.

Optionally, there may be a plurality of pixel drive circuits 20a. The plurality of pixel drive circuits 20a may be distributed in an array on the drive substrate 100. Particularly, the plurality of pixel drive circuits 20a may be distributed in an array on the light-emitting area AA. The pixel drive circuit(s) 20 may be used to control the light-emitting element 200.

Optionally, the electrostatic discharge circuit 20b may be used to protect important parts in the device from being damaged by static electricity, for example, it can be used to protect a data line 41 from being broken down by static electricity. There may be a plurality of electrostatic discharge circuits 20b. The electrostatic discharge circuit(s) 20b may be connected to the data line 41.

Optionally, the second signal line 22 may be disposed on the side of the first signal line 21 away from the light-emitting area AA. It may be understood in a way that when looked from the light-emitting area AA to the frame area NA, the second signal line 22 is disposed on the side of the first signal line 21 away from the light-emitting area AA.

That is to say, an orthographic projection of the second signal line 22 on the substrate 10 is disposed farther from an orthographic projection of the light-emitting area AA than an orthographic projection of the first signal line 21 on the substrate 10.

Optionally, the number of the first signal line 21 and the number of the second signal line 22 are not specifically limited, and can be set according to demands of the pixel drive circuit 20a and the electrostatic discharge circuit 20b. When both the number of the first signal line 21 and the number of the second signal line 22 are more than two, each second signal line 22 is located on the side of each first signal line 21 away from the light-emitting area AA.

Optionally, the first signal line 21 may be electrically connected to either of the pixel drive circuit 20a and the light-emitting element 200, that is, either of the pixel drive circuit 20a or a pad connected to the light-emitting element 200 may be leaded to the frame area NA to be electrically connected to the first signal line 21 in the frame area NA, or optimally, any one of the pixel drive circuit (s) 20a or light-emitting element(s) 200 may be leaded to the frame area NA to be electrically connected to the first signal line 21 in the frame area NA. Certainly, the first signal line 21 in the frame area NA may be leaded to the light-emitting area AA, to be electrically connected to any one of pixel drive circuit (s) 20a or light-emitting element(s) 200, for example, each trace leaded from the first signal line 21 to the light-emitting area AA may be electrically connected to at least one pixel drive circuit 20a or at least one light-emitting element 200.

Optionally, that the second signal line is spaced from the first signal line 21 may be understood in a way that when looked from the light-emitting area AA to the frame area NA, the orthographic projection of the first signal line 21 and the orthographic projection of the second signal line 22 are spaced from each other at any position and do not overlap with each other.

In the drive substrate 100 provided by the embodiment of the present application, the device layer 20 is disposed on the substrate 10 and includes the electrostatic discharge circuit 20b, the first signal line 21 and the second signal line 22 disposed in the frame area NA. The first signal line 21 is electrically connected to the pixel drive circuit 20a and the light-emitting element 200, and the second signal line 22 is electrically connected to the electrostatic discharge circuit 20b. With the above arrangements, a requirement for connection between the second signal line 22 and the electrostatic discharge circuit 20b can be satisfied. Since a space of the light-emitting area AA is limited, there is a need to keep the number of traces as little as possible. The traces in the light-emitting area AA can be decreased to ensure the light-emitting requirement, by disposing the first signal line 21 in the frame area. Further, disposing both the first signal line 21 and the second signal line 22 in the frame area can ensure the consistency of the voltage drop between them. Meanwhile, the second signal line 22 is disposed on the side of the first signal line 21 away from the light-emitting area AA and is spaced from the first signal line 21, so that no matter under a condition that either of the pixel drive circuit 20a or the pad connected to the light-emitting element 200 is leaded to the frame area NA to be electrically connected to the first signal line 21, or under another condition that the first signal line 21 in the frame area NA is leaded to the light-emitting area AA to be electrically connected to at least one pixel drive circuit 20a or light-emitting element 200, any trace for connecting the first signal line 21 and the pixel drive circuit 20a or the light-emitting element 200 will not be bridged with the second signal line 22, so as to reduce the overlap between them. Even if the drive substrate 100 is in an environment of high temperature, high humidity and the like, since the trace connected to the first signal line 21 does not overlap with the second signal line 22, ion migration will not occur even though there may be a potential difference between them. Therefore, electrochemical corrosion can be avoided, and the safety performance of the drive substrate 100 can be guaranteed.

As an optional implementation, as further shown in FIGS. 1-3, in the drive substrate 100 provided by the embodiment of the present application, the first signal line 21 and the second signal line 22 may include power signal lines. A voltage signal may be provided to the pixel drive circuit 20a and the light-emitting element 200 through the first signal line 21, and a voltage signal may be provided to the electrostatic discharge circuit 20b through the second signal line 22, to satisfy the work demands of the pixel drive circuit 20a and the electrostatic discharge circuit 20b.

Moreover, since a power signal line transmits a fixed potential and transmits a voltage signal continuously for a long time, both the first signal line 21 and the second signal line 22 include the power signal lines and the second signal line 22 is disposed on the side of the first signal line 21 away from the light-emitting area AA and is spaced from the first signal line 21, so that the overlap between the signal lines transmitting fixed potentials for a long time can be reduced, so as to further reduce a probability of electrochemical corrosion of the drive substrate 100 in the environment of high temperature, high humidity and the like, and improve the safety performance of the drive substrate 100.

In some optional embodiments, as further shown in FIGS. 1-3, in the drive substrate 100 provided by the embodiment of the present application, the first signal line 21 may include a first sub-signal line 211 electrically connected to one of the pixel drive circuit 20a and the light-emitting element 200, and the second signal line 22 may include a third sub-signal line 221 and a fourth sub-signal line 222 each electrically connected to the electrostatic discharge circuit 20b. When looked from the light-emitting area AA to the frame area NA, the third sub-signal line 221 is disposed between the first sub-signal line 211 and the fourth sub-signal line 222, and the first sub-signal line 211 is disposed on a side of the third sub-signal line 221 facing toward the light-emitting area AA. The first sub-signal line 211 transmits either of a high-level signal and a low-level signal, and one of the third sub-signal line 221 and the fourth sub-signal line 222 transmits a high-level signal and the other one transmits a low-level signal.

Since level signals provided by traces for providing a high-level signal and a low-level signal are direct current (DC) signals with fixed potential, when the pixel drive circuit 20a, the light-emitting element 200 and the electrostatic discharge circuit 20b are in operation, if the traces overlap with each other, due to a thin insulation layer between them (generally only a few microns to tens of nanometers), a path for electrochemical corrosion is easily formed, resulting in metal corrosion and short circuit.

However, the drive substrate 100 provided by the embodiment of the present application, with the above arrangements, may transmit one of a high-level signal and a low-level signal to the pixel drive circuit 20a through the first sub-signal line 211, to guarantee the operation of the pixel drive circuit 20a and a control requirement of the light-emitting element 200, and transmit a high-level signal to the electrostatic discharge circuit 20b through one of the third sub-signal line 221 and the fourth sub-signal line 222 and transit a low-level signal on the other one of the third sub-signal line 221 and the fourth sub-signal line 222, so as to guarantee the operation of the electrostatic discharge circuit 20b, and in turn guarantee the electrostatic discharge (ESD) requirement of corresponding traces in the device layer 20.

Moreover, when looked from the light-emitting area AA to the frame area NA, the third sub-signal line 221 is disposed between the first sub-signal line 211 and the fourth sub-signal line 222, and the first sub-signal line 211 is disposed on the side of the third sub-signal line 221 facing toward the light-emitting area AA, so that the electrostatic discharge circuit 20b located in the frame area can be electrically connected to the third sub-signal line 221 and the fourth sub-signal line 222, respectively, to obtain a high level and a low level, so as to guarantee the ESD requirement. In addition, the first sub-signal line 211 is disposed closer to the light-emitting area AA, so that the first sub-signal line 211 can be used to transmit a high level to the pixel drive circuit 20a or transmit a low level to the light-emitting element 200, so as to guarantee the lighting and control requirement of the light-emitting element 200, as well as reduce the traces in the light-emitting area AA.

Meanwhile, the first sub-signal line 211, when leaded to one of the pixel drive circuit 20a and the light-emitting element 200 located inside the light-emitting area AA, will not overlap with the third sub-signal line 221 and the fourth sub-signal line 222. Even if the drive substrate 100 is in an environment of high temperature, high humidity and the like, since there is no overlap between the trace connected to the first sub-signal line 211 and the third sub-signal line 221 and the fourth sub-signal line 222, ion migration will not occur even though there may be a potential difference between them. As a result, a path for electrochemical corrosion formed due to overlap between the trace of the first sub-signal line 211 for connecting with the pixel drive circuit 20a or the light-emitting element 200 and the third sub-signal line 221 and the fourth sub-signal line 222 can be avoided effectively, which reduces the probability of a short circuit phenomenon and improves the safety performance of the drive substrate 100.

Furthermore, the electrostatic discharge circuit 20b is disposed in the frame area NA, and the third sub-signal line 221 and the fourth sub-signal line 222 located in the frame area NA can be electrically connected to the electrostatic discharge circuit 20b in the frame area NA, without a need to be leaded to the light-emitting area AA. Therefore, there is no need for the third sub-signal line 221 and the fourth sub-signal line 222 to be bridged with the first sub-signal line 211, so that a bridge will not generated between the third sub-signal line 221 and the fourth sub-signal line 222 and the first sub-signal line 211, and the safety performance of the drive substrate 100 can be improved effectively.

As an optional implementation, as further shown in FIG. 1-3, the device layer 20 may further include a first signal transfer line 23 and a second signal transfer line 24. The first sub-signal line 211 is electrically connected to any one of the pixel drive circuit 20a and the light-emitting element 200 through the first signal transfer line 23. The first signal transfer line 23 is located in the light-emitting area AA and is electrically connected to one of the light-emitting element 200 and the pixel drive circuit 20a. The second signal transfer line 24 is located in the light-emitting area AA and extends at least partially to the frame area NA. The second signal transfer line 24 is electrically connected to the other one of the light-emitting element 200 and the pixel drive circuit 20a. The first signal transfer line 23 can be electrically connected to one of at least one pixel drive circuit 20a and light-emitting element 200, and optionally, can be electrically connected to one of a plurality of pixel drive circuits 20a and light-emitting elements 200. The second signal transfer line 24 can be electrically connected to the other one of the at least one pixel drive circuit 20a and light-emitting element 200, and optionally can be electrically connected to the other one of the plurality of pixel drive circuits 20a and light-emitting elements 200.

With the above arrangements, after the light-emitting element 200 is mounted on the drive substrate 100, one connection terminal of the light-emitting element 200 can be electrically connected to the pixel drive circuit 20a, and the other connection terminal can be electrically connected to the second signal transfer line 24. The second signal transfer line 23 can obtain a signal directly from a connection terminal located in the frame area. Since the second signal transfer line 24 is not bridged with each sub-signal line, the lighting and control requirement of the light-emitting element 200 can be satisfied, while a risk of electrochemical corrosion for the drive substrate 100 can be reduced and the safety can be improved.

In addition, by introducing the first signal transfer line 23 and the second signal transfer line 24, each first signal transfer line 23 can be electrically connected to one of the plurality of pixel drive circuits 20a or light-emitting elements 200, and each second signal transfer line 24 can be electrically connected to the other one of the plurality of pixel drive circuits 20a or light-emitting elements 200, so that the number of trace(s) introduced into the frame area NA when each pixel drive circuit 20a or light-emitting element 200 is electrically connected to the first sub-signal line 211 or the connection terminal in the frame area NA can be reduced, so as to reduce the traces in the light-emitting area AA and guarantee light-emitting effects.

As an optional implementation, as further shown in FIG. 1-3, when the first signal line 21 includes the first sub-signal line 211, the first sub-signal line 211 can be used to transmit a high-level signal, and correspondingly, the first signal transfer line 23 can be used to transmit the high-level signal to the pixel drive circuit 20a, and the second signal transfer line 24 can be used to provide a low-level signal to the light-emitting element 200.

It can be understood that, when the first signal line 21 includes the first sub-signal line 211, it is only an optional implementation that the first sub-signal line 211 is used to transmit the high-level signal.

Figure 4:
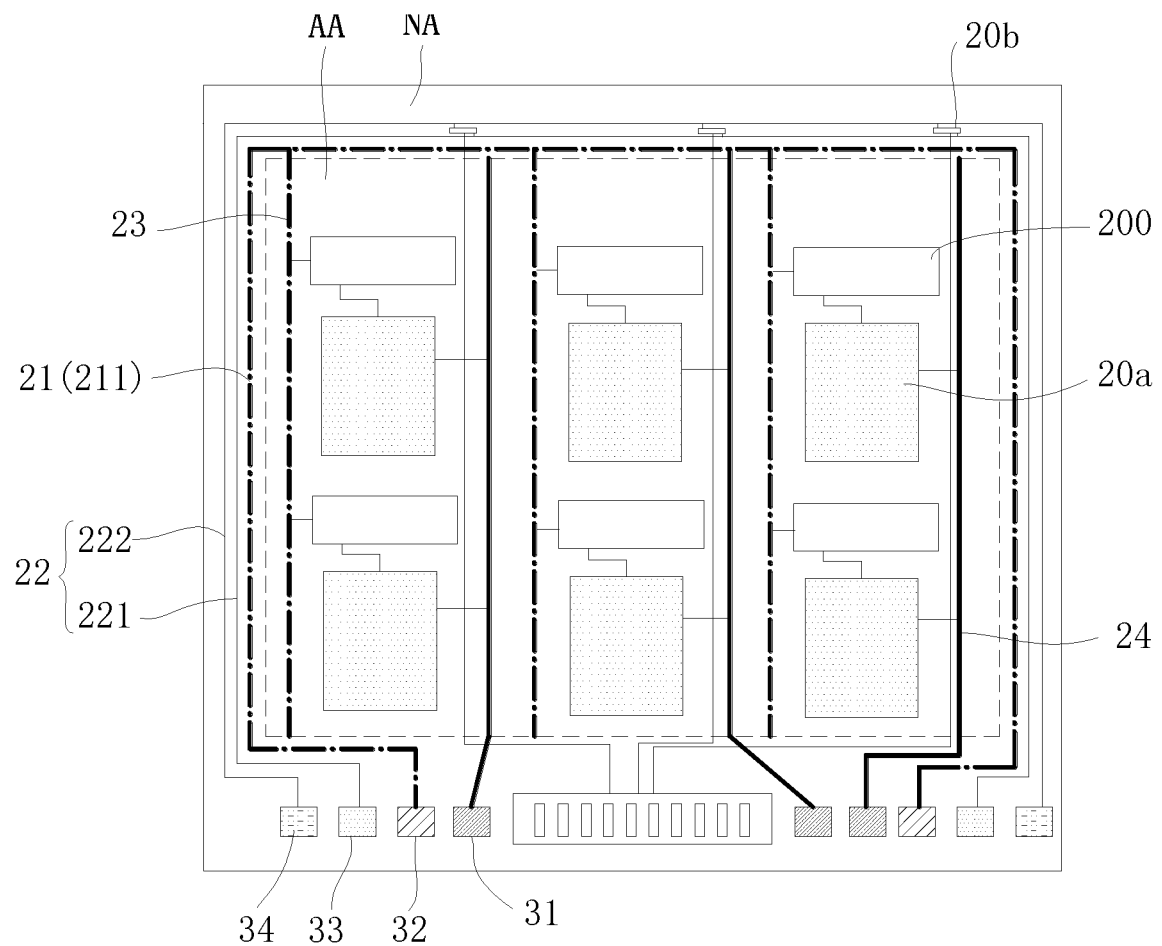
FIG. 4 is a schematic top view of a drive substrate of another embodiment of the present application.

As shown in FIG. 4, in some other embodiments, the first sub-signal lines 211 can also be used to transmit a low-level signal, and in this case, each first signal transfer line 23 can be used to transmit the low-level signal too, and used for the electrical connection with the light-emitting element 200, and correspondingly, the second signal transfer line 24 can be electrically connected to the pixel drive circuit 20a and used to transmit a high-level signal. The lighting and control requirement of the light-emitting element 200 can be satisfied as well.

As further shown in FIG. 4, as an optional implementation, in order to guarantee that the pixel drive circuit 20a and the electrostatic discharge circuit 20b can obtain the required high-level and low-level signals in a better way, a first connection terminal 31, a second connection terminal 32, a third connection terminal 33 and a fourth connection terminal 34 may be disposed in the frame area NA. The first connection terminal 31 may be electrically connected to the first sub-signal line 211. The second connection terminal 32 may be electrically connected to the part of the second signal transfer line 24 that extends to the frame area NA. The third connection terminal 33 may be electrically connected to the third sub-signal line 221. The fourth connection terminal 34 may be electrically connected to the fourth sub-signal line 222. Therefore, the drive substrate 100 can be bounded to a flexible circuit board 400 and obtain corresponding potential signals through the first connection terminal 31, the second connection terminal 32, the third connection terminal 33 and the fourth connection terminal 34 during operation.

As further shown in FIG. 4, optionally, the first connection terminal 31 and the first sub-signal line 211 can be used to transmit low-level signals, and the second connection terminal 32 and the second signal transfer line 24 can be used to transmit high-level signals. It can be understood that this is an optional implementation but not a limitation on the application. In some other embodiments, the first connection terminal 31 and the first sub-signal line 211 can be used to transmit high-level signals, and the second connection terminal 32 and the second signal transfer line 24 can be used to transmit low-level signals, as long as the performance requirement of the drive substrate 100 can be satisfied.

It can be understood that in the drive substrate 100 provided by the above embodiments of the present application, that the first signal line 21 includes the first sub-signal line 211 is used as an example for illustration, which is an optional implementation.

Figure 5:
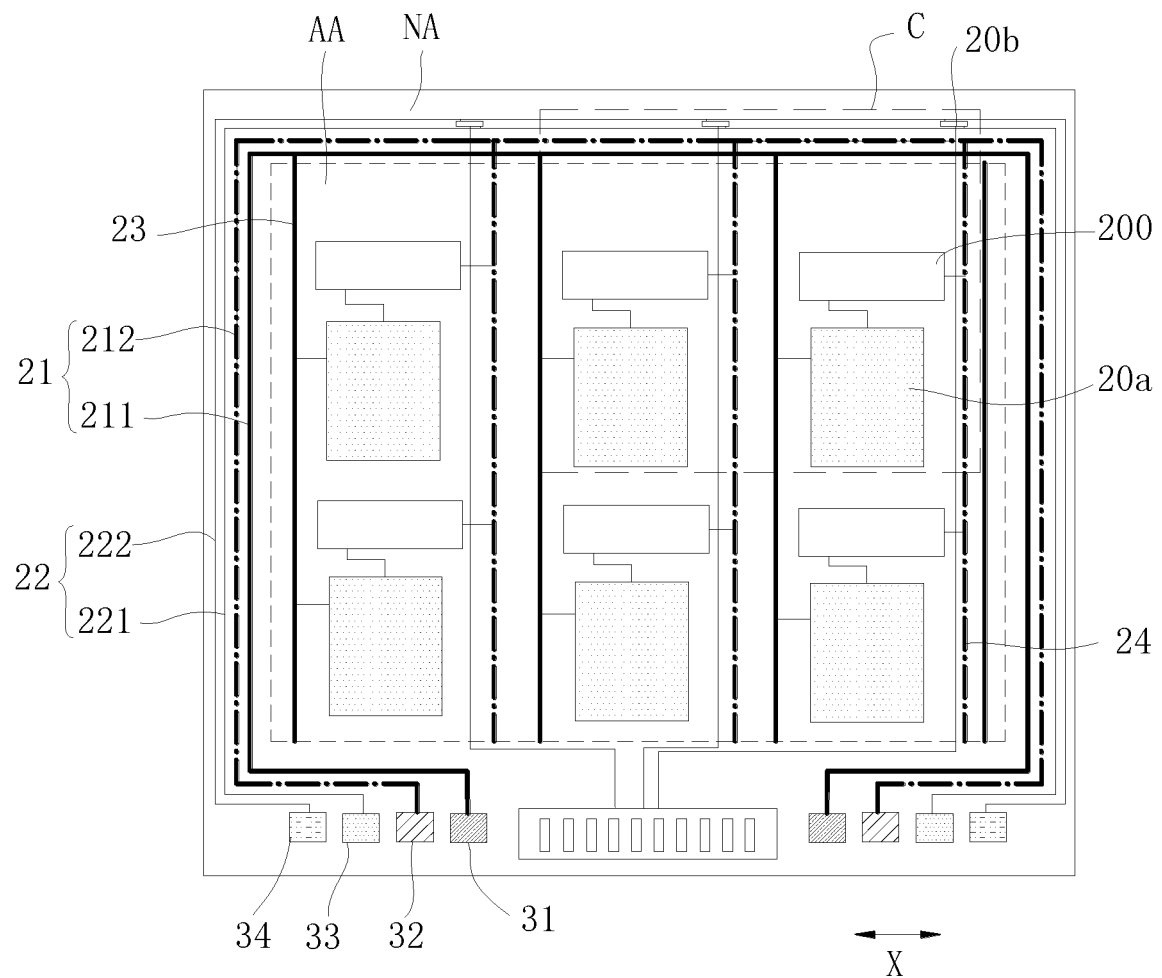
FIG. 5 is a schematic top view of a drive substrate of another embodiment of the present application.

As shown in FIG. 5, in some other embodiments, the first signal line 21 may further include a second sub-signal line 212 electrically connected to the other one of the pixel drive circuit 20a and the light-emitting element 200. When looked from the light-emitting area AA to the frame area NA, the second sub-signal line 212 is disposed between the first sub-signal line 211 and the third sub-signal line 221, and one of the first sub-signal line 211 and the second sub-signal line 212 transmits a high-level signal and the other one transmits a low-level signal.

With the above arrangement, the high-level signal can be transmitted to the pixel drive circuit 20a through one of the first sub-signal line 211 and the second sub-signal line 212, and the low-level signal can be transmitted to the light-emitting element 200 through the other one of the first sub-signal line 211 and the second sub-signal line 212, so that the lighting and driving requirements of the light-emitting element 200 can be satisfied.

As mentioned above, since the space of the light-emitting area AA is limited, there is the need to keep the number of traces as little as possible. The traces in the light-emitting area AA can be decreased to satisfy the light-emitting requirement, by disposing the first sub-signal line 211, second sub-signal line 212, third sub-signal line 221 and fourth sub-signal line 222 in the frame area NA. In addition, the second sub-signal line 212 is located between the first sub-signal line 211 and the third sub-signal line 221, that is to say, the third sub-signal line 221 and fourth sub-signal line 222 are located at the side of the second sub-signal line 212 away from the first sub-signal line 211, so that the second sub-signal line 212 and first sub-signal line 211, when connected with the pixel drive circuit 20a and light-emitting element 200, will not be bridged with the third sub-signal line 221 and fourth sub-signal line 222. Therefore, no ion migration will occur even though there may be a potential difference between the second sub-signal line 212 or first sub-signal line 211 and the third sub-signal line 221 or fourth sub-signal line 222. As a result, a path for electrochemical corrosion formed due to overlap between the traces of the first sub-signal line 211 and second sub-signal line 212 for connecting with the pixel drive circuit 20a or light-emitting element 200 and the third sub-signal line 221 and fourth sub-signal line 222 can be avoided effectively, which reduces the probability of a short circuit phenomenon and improves the safety performance of the drive substrate 100.

As an optional implementation, as further shown in FIG. 5, when the drive substrate 100 includes the first sub-signal line 211 and the second sub-signal line 212, the device layer 20 may still include the first signal transfer line 23 and the second signal transfer line 24. The first sub-signal line 211 may be electrically connected to the pixel drive circuit 20a through the first signal transfer line 23, and the second sub-signal line 212 may be electrically connected to the light-emitting element 200 through the second signal transfer line 24. The electrical connection requirements between first sub-signal line 211 and the second sub-signal line 212 and the corresponding pixel drive circuit 20a and light-emitting element 200 can be satisfied.

Figure 6:
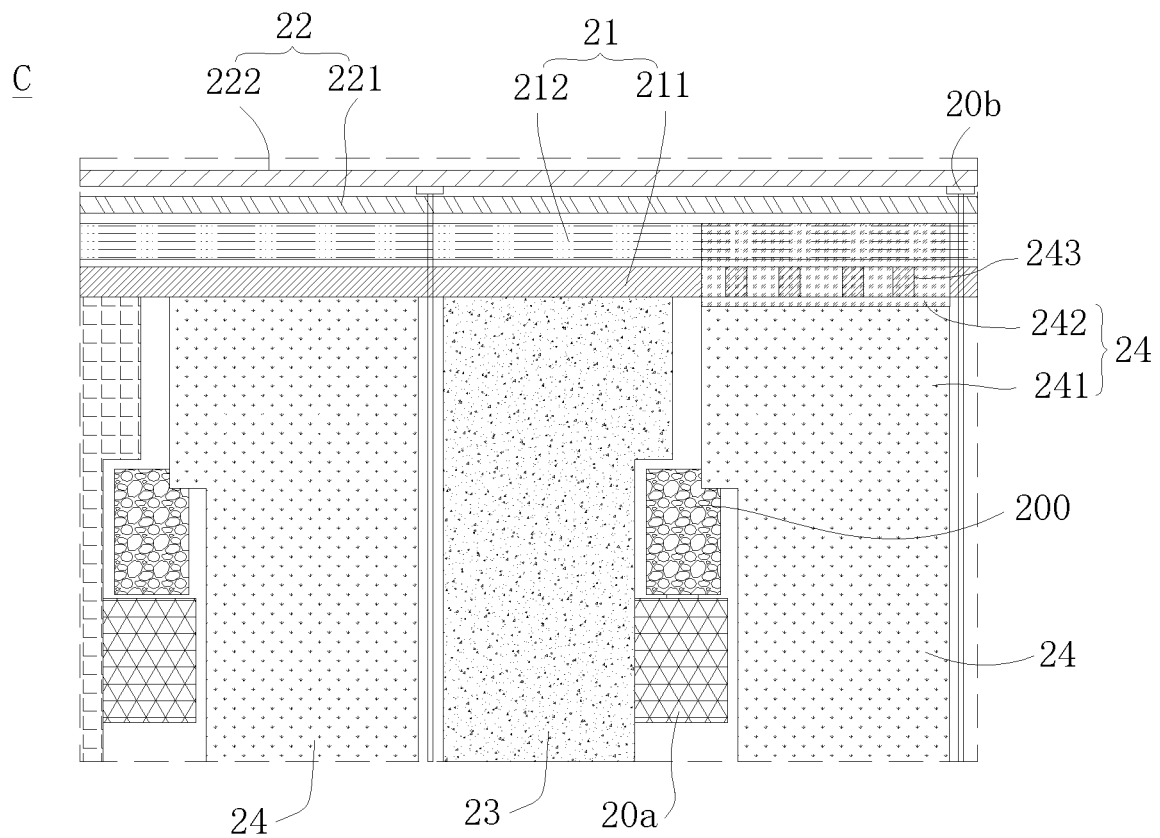
FIG. 6 is an enlarged partial view of a region C in FIG. 5.

As shown in FIG. 6, as an optional implementation, when the drive substrate 100 provided by the embodiment of the present application includes the second sub-signal line 212 and the second signal transfer line 24 is connected to the second sub-signal line 212, a first hollow hole 243 may be disposed on the second signal transfer line 24, and on the substrate 10, the orthographic projection of the first sub-signal line 211 overlaps with an orthographic projection of the first hollow hole 243. With the above arrangement, electrochemical corrosion of the drive substrate 100 in the environments such as high temperature and high humidity etc. can be avoided and the safety performance of the drive substrate 100 can be guaranteed, while an overlap area between the second signal transfer line 24 and the first sub-signal line 211 when the second signal transfer line 24 is bridged with the first sub-signal line 211 can be reduced, so as to reduce the overlap capacitance or parasitic capacitance, which is beneficial for safe operation of drive substrate 100.

As further shown in FIG. 6, as an optional implementation, in the drive substrate 100 provided in the embodiment of the present application, the second signal transfer line 24 may include a second connection segment 241 and a second transfer segment 242 connecting the second connection segment 241 and the second sub-signal line 212. The second signal transfer line 24 is electrically connected to the light-emitting element 200 through the second connection segment 241. Both the first signal transfer line 23 and the second connection segment 241 are located in the light-emitting area AA. The second transfer segment may be disposed through the first hollow hole. The above-mentioned arrangement of the second signal transfer line 24 is beneficial for connecting the second sub-signal line 212 to the light-emitting element 200 and can effectively reduce the overlap area between the second signal transfer line 24 and the first sub-signal line 211.

Optionally, the second connection segment 241 and the second transfer segment 242 may be disposed in the same layer. The second connection segment 241 and second transfer segment 242 that are disposed in the same layer, and the first sub-signal line 211 and second sub-signal line 212, may be disposed in different layers. The second transfer segment 242 may be connected with the second sub-signal line 212 through a via hole. Of course, in some embodiments, the second connection segment 241 and the second transfer segment 242 may be disposed in different layers and connected with each other through a via hole, as long as the electrical connection relationship between the second connection segment 241 and the second transfer segment 242 can be guaranteed, so as to guarantee the connection relationship between the second sub-signal line 21 and the pixel drive circuit 20a or the light-emitting element 200.

As further shown in FIG. 6, as an optional implementation, in the drive substrate 100 provided by the embodiment of the present application, there may be a plurality of first hollow holes 243 spaced apart from each other. With the plurality of first hollow holes 243, the overlap area between the second signal transfer line 24 and the first sub-signal line 211 can be further reduced and the safety performance of the drive substrate 100 can be guaranteed, while the overlap capacitance between the second signal transfer line 24 and the first sub-signal line 211 can be reduced, which is beneficial for the safe operation of the drive substrate 100.

Optionally, the plurality of first hollow holes 243 may be disposed at intervals along the extending direction of the first sub-signal line 211 to reduce the overlap area between the second signal transfer line 24 and the first sub-signal line 211.

Optionally, each second connection segment 241 may be connected to the second sub-signal line 212 through the second transfer segment 242. Of course, this is an optional implementation. In some embodiments, one of a plurality of second connection segments 241 is connected to the second sub-signal line 212 through the second transfer segment 242.

As an optional implementation, in the drive substrate 100 provided in this embodiment of the present application, when the first signal line 21 includes the second sub-signal line 212, each of the second sub-signal line 212 and the third sub-signal line 221 can be used to transmit a low-level signal. With the above arrangement, in the direction from the light-emitting area AA to the frame area NA, a potential difference between two adjacent signal lines is small, so as to prevent signal transmissions of the two adjacent signal lines from being affected by each other due to a large potential difference between them and optimize the performance of the drive substrate 100.

Figure 7:
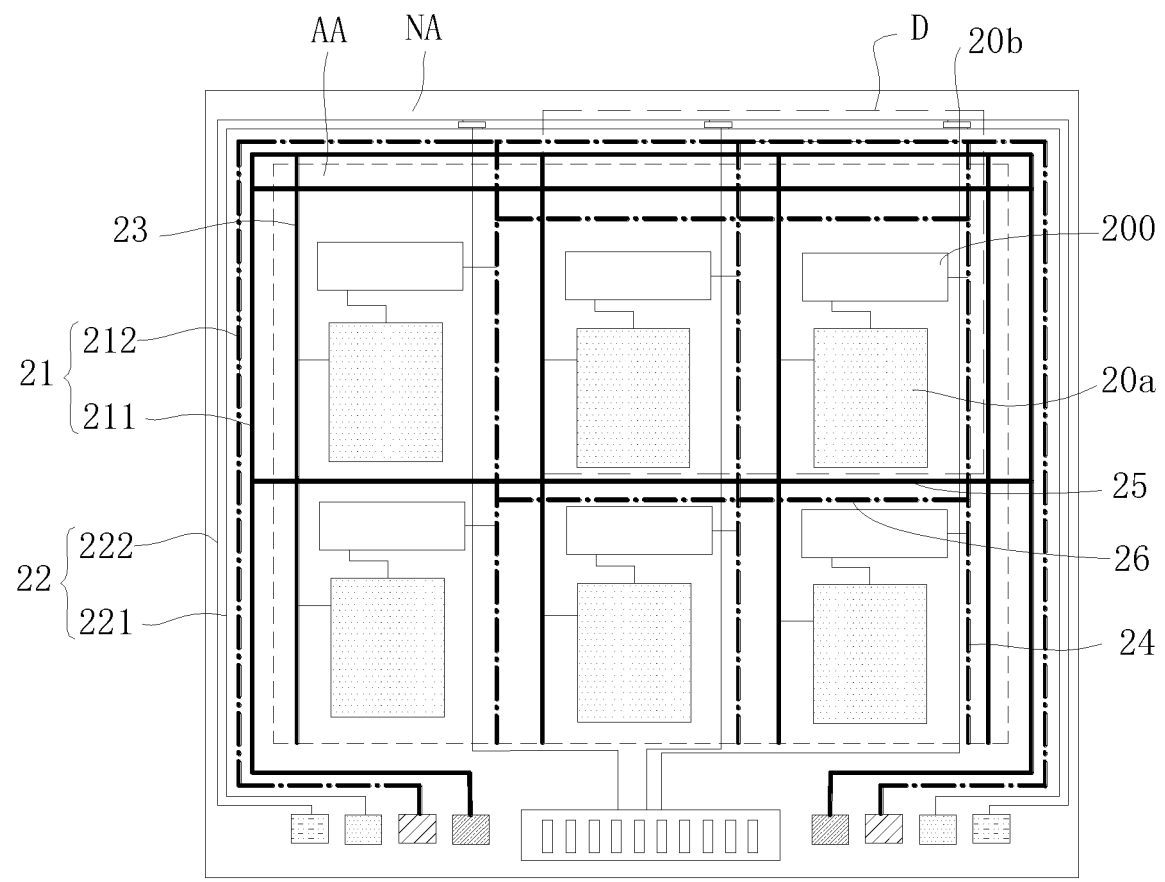
FIG. 7 is a schematic top view of a drive substrate of another embodiment of the present application.
Figure 8:
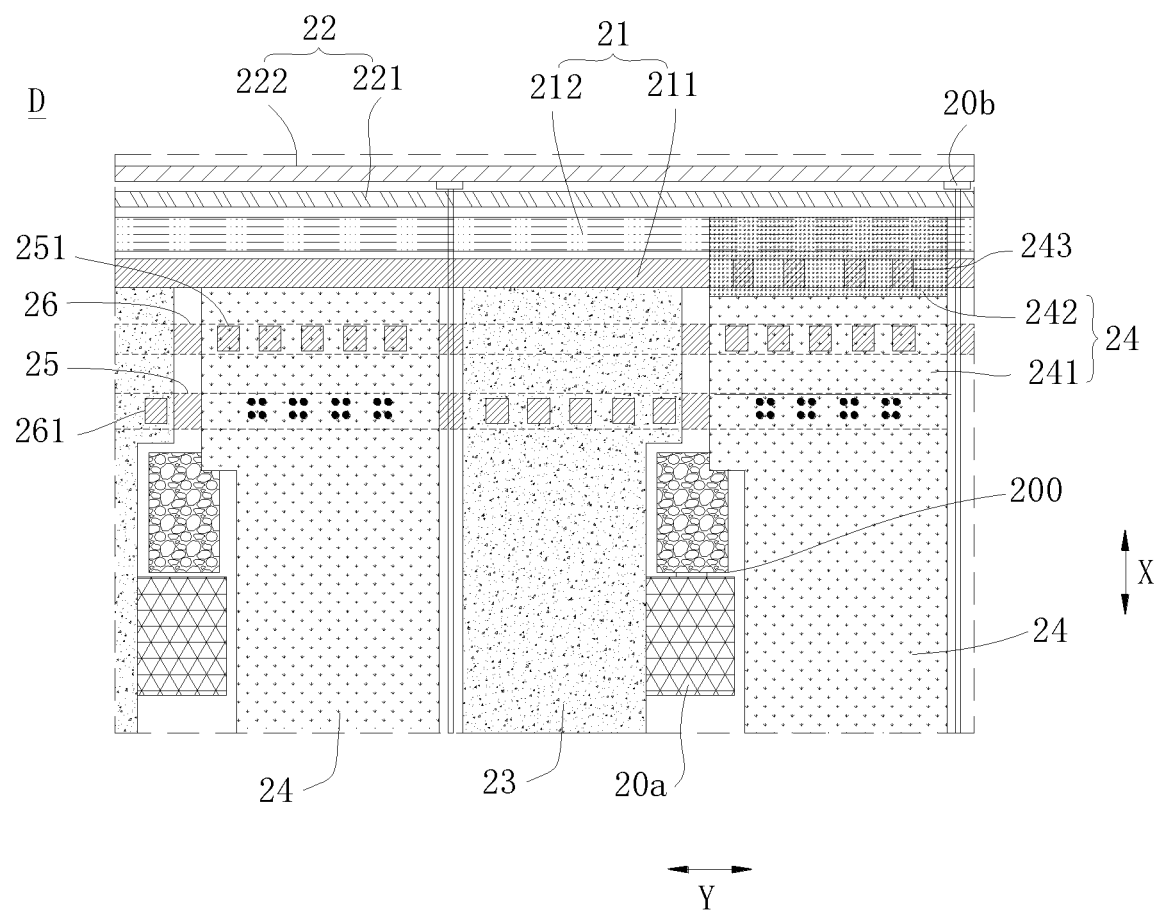
FIG. 8 is an enlarged partial view of a region D in FIG. 7.

As shown in FIG. 7 and FIG. 8, in some optional embodiments, the first signal transfer line 23 and the second signal transfer line 24 may be disposed alternately along the same direction. The device layer 20 may further include a first jumper line 25 and a second signal transfer line 26. The first jumper line 25 may intersect with and may be electrically connected to each first signal transfer line 23, and the second jumper line 26 may intersect with and may be electrically connected to each second signal transfer line 24. The first signal transfer line 23 may have a second hollow hole 251 provided thereon and the second signal transfer line 24 may have a third hollow hole 261 provided thereon. On the substrate 10, an orthographic projection of the first jumper line 25 may overlap with an orthographic projection of the third hollow hole 261 and an orthographic projection of the second jumper line 26 may overlap with an orthographic projection of the second hollow hole 251.

Since there are a plurality of pixel drive circuits 20a distributed in an array in the light-emitting area AA, by disposing the first signal transfer line 23 and the second signal transfer line 24 alternately along the same direction, it is beneficial for the electrical connection of the pixel drive circuits 20a distributed in an array with corresponding light-emitting elements 200. In addition, since the signals of the first sub-signal line 211 and the second sub-signal line 212 are power signals introduced by the first connection terminal 31 and the second connection terminal 32 from outside, during transmission, locations farther away from the first connection terminal 31 and the second connection terminal 32 would have greater voltage drops. The first jumper 25 and the second jumper 26 are introduced to electrically connect respective first signal transfer lines 23 with each other and electrically connect respective second signal transfer lines 24, so as to reduce voltage drops of high-level signals and low-level signals during transmission.

At the same time, the first signal transfer line 23 has the second hollow hole 251 provided thereon and the second signal transfer line 24 has the third hollow hole 261 provided thereon, and on the substrate 10, the orthographic projection of the first jumper line 25 overlaps with the orthographic projection of the third hollow hole 261 and the orthographic projection of the second jumper line 26 overlaps with the orthographic projection of the second hollow hole 251, so that the overlap between the first jumper lines 25 and the second signal transfer lines 24 and the overlap area between the second jumper line 26 and the first signal transfer line 23 can be reduced, parasitic capacitances can be reduced, and the performance of the drive substrate 100 can be optimized.

In some optional embodiments, the first signal transfer line 23 and the second signal transfer lines 24 may be disposed alternately in a second direction Y, and the first jumper lines 25 and the second jumper lines 26 may be distributed at intervals along a first direction X. Optionally, the first direction X and the second direction Y are perpendicular to each other.

As an optional implementation, there may be a plurality of second hollow holes 251 spaced apart from each other. The plurality of second hollow holes 251 can further reduce the overlap area between the second jumper line 26 and the first signal transfer line 23. Optionally, the plurality of second hollow holes 251 may be distributed at intervals along the extending direction of the second jumper line 26.

As an optional implementation, there may be a plurality of third hollow holes 261 spaced apart from each other. The plurality of third hollow holes 261 can further reduce the overlap area between the first jumper line 25 and the second signal transfer line 24. Optionally, the plurality of third hollow holes 261 may be distributed at intervals along the extending direction of the first jumper line 25.

Figure 9:
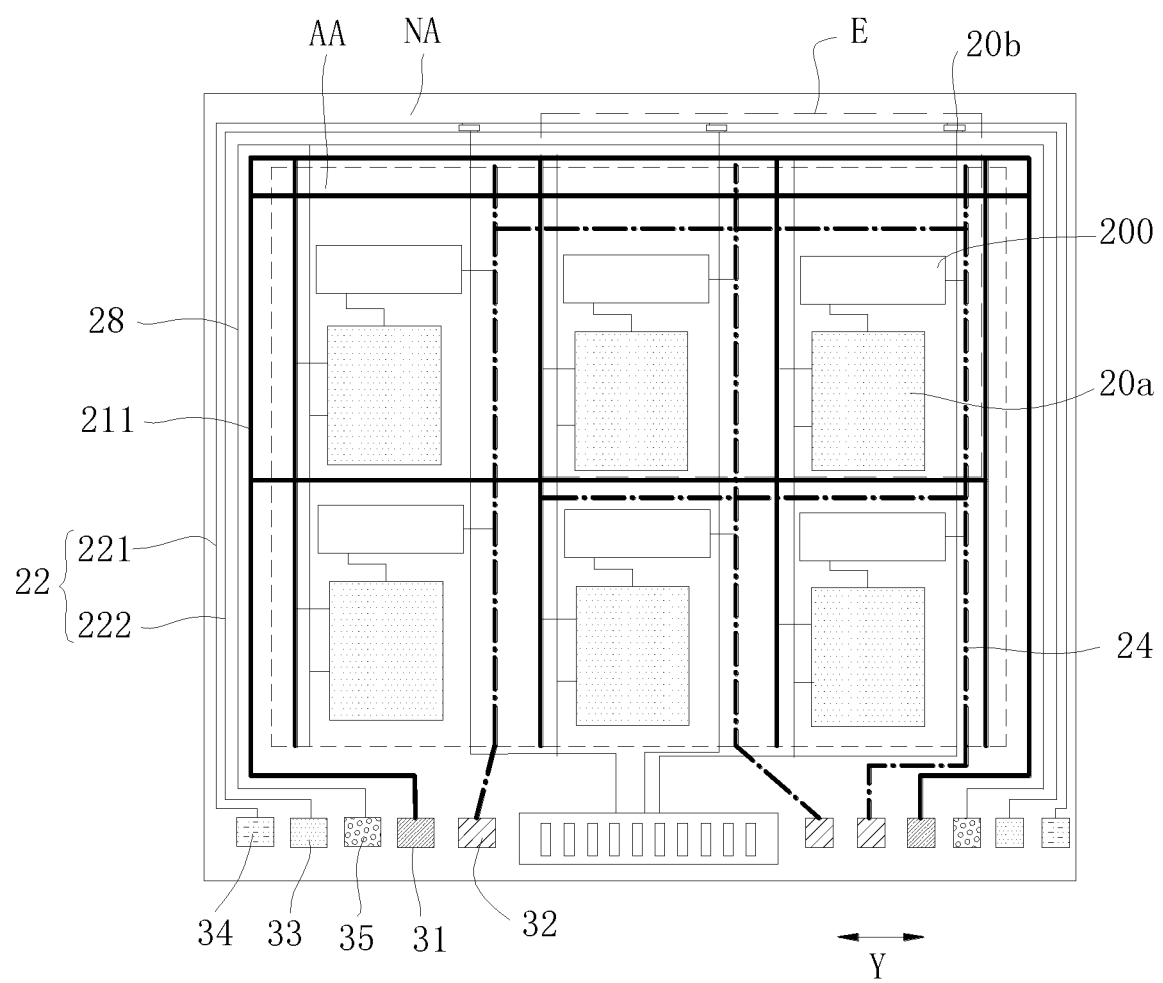
FIG. 9 is a schematic top view of a drive substrate of another embodiment of the present application.
Figure 10:
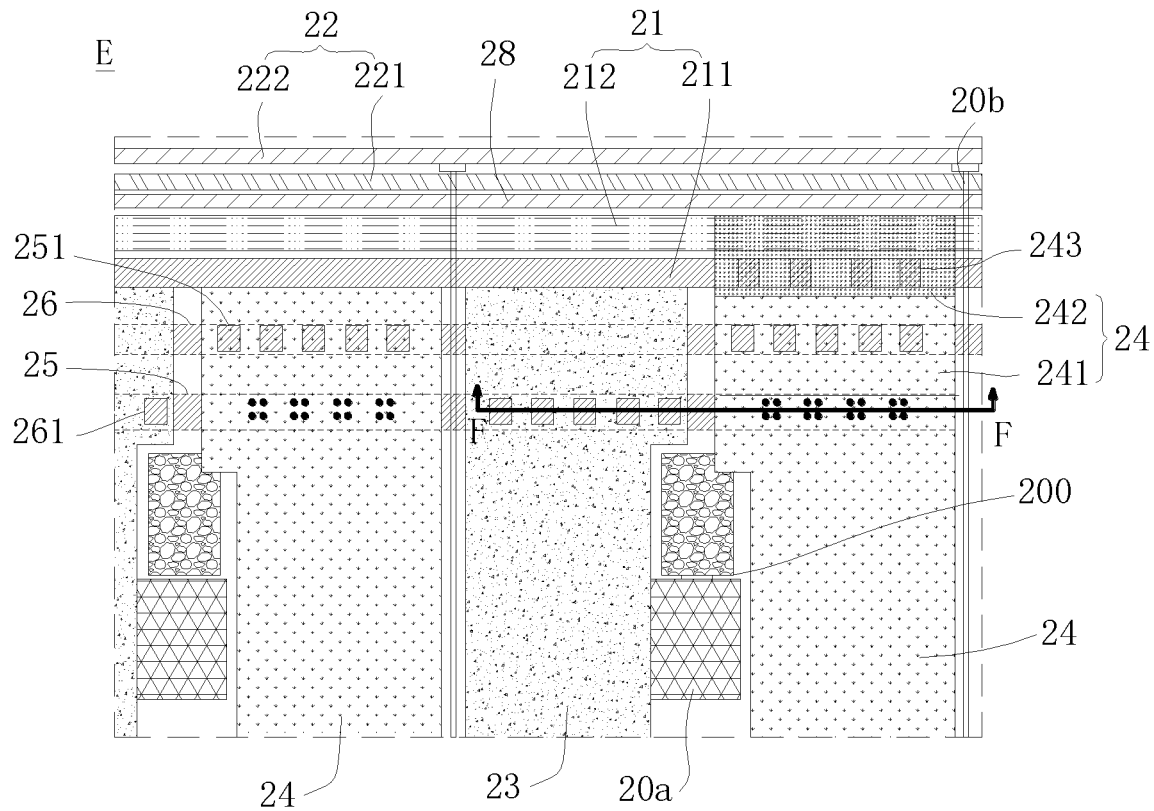
FIG. 10 is an enlarged view of a region E in FIG. 9.

As shown in FIG. 9 and FIG. 10, as an optional implementation, the drive substrate 100 provided in the embodiment of the present application may further include a reference signal line 28 disposed in the frame area NA. The reference signal line 28 may be electrically connected to the pixel drive circuit 20a. The reference signal line 28 may be configured to provide a reference voltage to the pixel drive circuit 20a. The reference voltage may be used to reset the gate of a drive tube and the anode of the light-emitting element 200 in the pixel drive circuit 20a, when the pixel drive circuit 20a is initially initialized Optionally, when looked from the light-emitting area AA to the frame area NA, the reference signal line 28 may be located between the first signal line 21 and the second signal line 22. The reference signal line 28 may be connected to a negative voltage that is a fixed voltage, so as to effectively prevent signal transmissions of the two adjacent signal lines from being affected by each other due to a large potential difference between them and optimize the performance of the drive substrate 100.

Optionally, the device layer 20 may further includes a fifth connection terminal 35. The reference signal line 28 may be electrically connected to the fifth connection terminal 35, so as to be connected to the outside and obtain a reference voltage through the fifth connection terminal 35.

Figure 11:
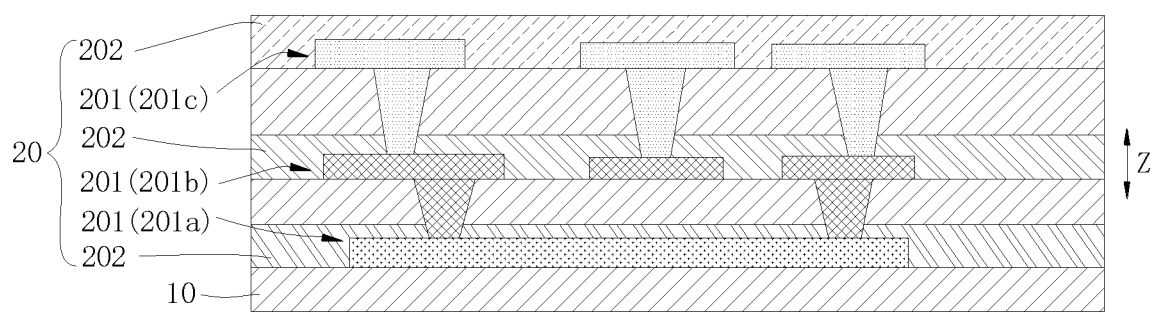
FIG. 11 is a sectional view along an F-F direction in FIG. 10.

As shown in FIG. 11, as an optional implementation, in the drive substrate 100 provided in the embodiment of the present application, the device layer 20 may include n metal layers 201 stacked in the thickness direction of the substrate 10 and an insulation layer 202 located between every two adjacent metal layers 201. In the thickness direction z, a $1^{st}$ layer of the metal layers 201 may be located between an $n^{th}$ layer of the metal layers 201 and the substrate 10, and n is an integer greater than or equal to 2

In some optional embodiments, the first jumper line 25 and the first signal transfer line 23 may be disposed in different layers and connected through a first via hole, and the first jumper line 25 may be disposed in the $1^{st}$ layer 201a of the metal layers. With the above arrangement, the first signal transfer line 23 and the first sub-signal line 211 may be disposed in the same layer, which is beneficial for the connection between them. Meanwhile, the first jumper line 25 and the first signal transfer line 23 are disposed in different layers and the first jumper line 25 is disposed in the $1^{st}$ layer 201a of the metal layers, so that electrical connection requirements between respective first signal transfer lines 23 can be satisfied, and since the $1^{st}$ layer 201a of the metal layers is farther from the top surface or light-exiting surface of the drive substrate and there may be a plurality of insulation layers over it, the safety is higher and the first jumper line 25 is not easily corroded.

In some optional embodiments, the second jumper line 26 and the second signal transfer line 24 may be disposed in different layers and connected through a second via hole, and both the second transfer segment 242 and the second jumper line 26 may be disposed in the $1^{st}$ layer 201a of the metal layers. With the above arrangement, the second transfer segment 242 and the first sub-signal line 211 are disposed in different layers, which facilitate the connection between the second transfer segment 242 and the second connection section 241 through the second via hole instead of through the second sub-signal line 212, so as to guarantee the safety of the drive substrate 100. Similarly, since the $1^{st}$ layer 201a of the metal layers is farther from the top surface or light-exiting surface of the drive substrate and there may be a plurality of insulation layers over it, the safety is higher and the second jumper line 26 is not easily corroded.

n may be equal to 3, that is to say, the device layer 20 may include three metal layers 201, and insulation layers 202 may be disposed between every two adjacent metal layers 201 and on the side of each of the two outermost metal layers 201 facing away from each other. When the device layer 20 includes the three metal layers 201, the gate of a transistor included in the pixel drive circuit 20a and the gate of a transistor included in the electrostatic discharge circuit 20b can be formed on the $1^{st}$ layer 201a of the metal layers, and the source and drain of the transistor of each of the pixel drive circuit 20a and the electrostatic discharge circuit 20b can be formed on the $2^{nd}$ layer 201b of the metal layers and the $3^{rd}$ layer 201c of the metal layers. The part of the sources located in the $3^{rd}$ layer 201c of the metal layers and the part of the drains located in the $3^{rd}$ layer 201c of the metal layers may have the same or approximately the same pattern and electrically connected to each other. One of electrode plates of a storage capacitor included in the pixel drive circuit 20a may be formed on the first metal layer 201a, and the other electrode plate may be formed on the $2^{nd}$ layer 201b of the metal layers.

All signal lines located in the frame area NA, such as the first sub-signal line 211, the second sub-signal line 212, the third sub-signal line 221 and the fourth sub-signal line 222 etc., can be formed on the $2^{nd}$ layer 201b of the metal layers, so that, correspondingly, the first jumper line 25, the second jumper line 26 and the second transfer segment 242 of the second signal transfer line 24 may all be disposed on the first metal layer 201a. The first signal transfer line 23 may be formed on the $2^{nd}$ layer 201b of the metal layers and the $3^{rd}$ layer 201c of the metal layers, and its part located in the $2^{nd}$ layer 201b of the metal layers is electrically connected to its part located in the $3^{rd}$ layer 201c of the metal layers. The second connection segment 241 of the second signal transfer line 24 may be formed on the $2^{nd}$ layer 201b of the metal layers and the $3^{rd}$ layer 201c of the metal layers, and its part located in the $2^{nd}$ layer 201b of the metal layers may be electrically connected to its part located in the $3^{rd}$ layer 201c of the metal layers. With the above arrangement, resistances can be reduced and the performance of the drive substrate 100 can be optimized.

It can be understood that it is only an optional implementation that n is equal to 3, and in some other embodiments, n may be equal to 2, that is to say, the device layer 20 may include two metal layers 201, and insulation layers 202 may be disposed between the two metal layers 201 and on the side of each of the two metal layers 201 facing away from each other. The gate of a transistor included in the pixel drive circuit 20a and the gate of a transistor included in the electrostatic discharge circuit 20b can be formed on the $1^{st}$ layer of the metal layers 201, and the source and drain of the transistor of each of the pixel drive circuit 20a and the electrostatic discharge circuit 20b can be formed on the $2^{nd}$ layer of the metal layers 201. One of electrode plates of a storage capacitor included in the pixel drive circuit 20a may be formed on the $1^{st}$ layer of the metal layers 201, and the other electrode plate may be formed on the $2^{nd}$ layer of the metal layers 201.

All signal lines located in the frame area NA, such as the first sub-signal line 211, the second sub-signal line 212, the third sub-signal line 221 and the fourth sub-signal line 222 etc., can be formed on the $2^{nd}$ layer of the metal layers 201, so that, correspondingly, the first jumper line 25, the second jumper line 26 and the second transfer segment 242 of the second signal transfer line 24 may all be disposed on the $1^{st}$ layer of the metal layers 201.

Figure 12:
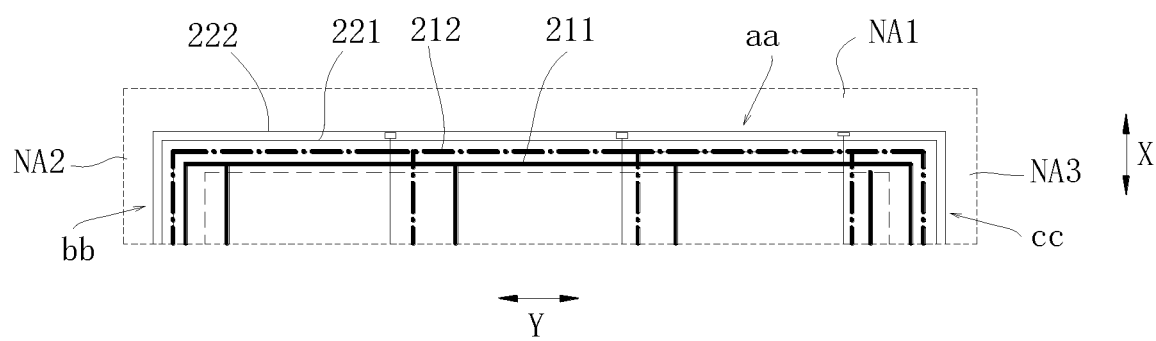
FIG. 12 is a schematic top view of a part of a drive substrate of another embodiment of the present application.

As shown in FIG. 12, in some optional embodiments, in the drive substrate 100 provided by the embodiment of the present application, when looked from the light-emitting area AA to the frame area NA, a distance between the first signal line 21 and the second signal line 22 may be greater than or equal to 3 microns. With the above arrangement, when looked from the light-emitting area AA to the frame area NA, the distance between the first signal line 21 and the second signal line 22 is moderate, and thus when there is a potential difference between them, mutual influences between them can be reduced.

The distance between the first signal line 21 and the second signal line 22 is a vertical distance between them along the direction parallel to the drive substrate. As an example, the first signal line 21 includes the first sub-signal line 211 and the second sub-signal line 212, and the second signal line 22 includes the third sub-signal line 221 and the fourth sub-signal line 222. In this example, when looked from the light-emitting area AA to the frame area NA, the first sub-signal line 211, the second sub-signal line 212, the third sub-signal line 212 The sub-signal lines 221 and the fourth sub-signal lines 222 may be disposed successively, and a distance between the second sub-signal line 212 of the first signal line 21 and the third sub-signal line 221 of the second signal line 22 may be greater than or equal to 3 microns.

As further shown in FIG. 12, in some optional embodiments, in the drive substrate 100 provided by the embodiment of the present application, the frame area NA may include a binding area NA4 and an upper frame area NA1 oppositely disposed in the first direction X, a first side frame area NA2 and a second side frame area NA3 oppositely disposed in the second direction Y. The binding area NA4 and the upper frame area NA1 may be oppositely disposed on both sides of the light-emitting area AA in the first direction X, and the first side frame area NA2 and the second side frame area NA3 may be oppositely disposed on both sides of the light-emitting area AA in the second direction Y. The binding area NA4 may be used to bind a drive chip. Each of the signal lines may include a first line segment aa located in the upper frame area NA1, a second line segment bb located in the first side frame area NA2, and a third line segment cc located in the second side frame area NA3. The second line segment bb may be connected to one end of the first line segment aa in the second direction Y, and the third line segment cc may be connected to the other end of the first line segment aa in the second direction Y. The first line segment aa and the second line segment bb may be electrically connected to corresponding connection terminals to obtain electrical signals.

As an optional implementation, when looked from the light-emitting area AA to the frame area NA, first line segments aa located in the upper frame area NA1 of respective signal lines may be spaced from and parallel to each other in the first direction X, second line segments bb located in first side frame area NA2 of respective signal lines may be spaced from and parallel to each other in the second direction Y, and parts located in second side frame area NA3 may be spaced from and parallel to each other.

In the direction of the light-exiting surface of the drive substrate, a vertical distance between the first line segment aa of the second signal line 22 and the first line segment aa of the third signal line may be greater than or equal to 3 microns, a vertical distance between the second line segment bb of the second signal line 22 and the second line segment bb of the third signal line may be greater than or equal to 3 microns, and a vertical distance between the third line segment cc of the second signal line 22 and the third line segment cc of the third signal line may be greater than or equal to 3 microns.

As an optional implementation, a distance between respective sub-signal lines of the first signal line 21 may be greater than or equal to 3 microns, for example, the distance between the first sub-signal line 211 and the second sub-signal line 212 may be greater than or equal to 3 microns, and a distance between respective sub-signal lines of the second signal line 22 may be greater than or equal to 3 microns too, for example, the distance between the third sub-signal line 221 and the fourth sub-signal line 222 may be greater than or equal to 3 micrometers.

Figure 13:
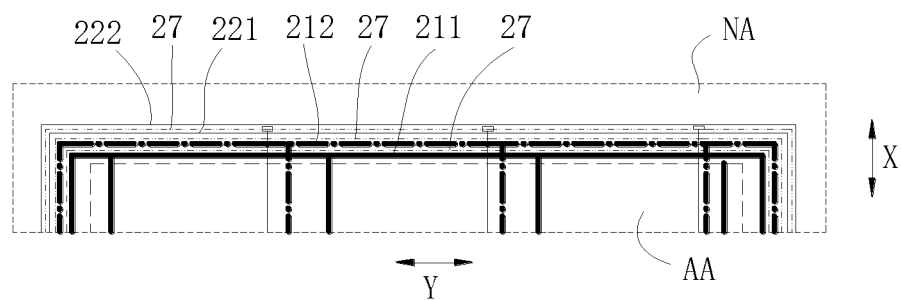
FIG. 13 is a schematic top view of a part of a drive substrate of another embodiment of the present application.

As shown in FIG. 13, in some optional embodiments, in the drive substrate 100 provided by the embodiment of the present application, the device layer 20 may further include a separation trace 27 disposed in the frame area NA. When looked from the light-emitting area AA to the frame area NA, the separation trace 27 may be disposed between the first sub-signal line 211 and the second sub-signal line 212. Since one of the first sub-signal line 211 and the second sub-signal line 212 can transmit a high-level signal and the other one can transmit a low-level signal, with the separation trace 27 disposed between them, when looked from the light-emitting area AA to the frame area NA, the first sub-signal line 211 and the second sub-signal line 212 can be isolated by the separation trace 27, to avoid a parasitic capacitance generated between them due to a potential difference between them, which affects the performance of the drive substrate 100.

Optionally, there may be the separation trace 27 between the orthographic projection of the first sub-signal line 211 and the orthographic projection of the second sub-signal line 212 on the substrate 10.

Optionally, the separation trace 27 may be disposed between the second sub-signal line 212 and the third sub-signal line 221.

Optionally, the separation trace 27 may be disposed between the third sub-signal line 221 and the fourth sub-signal line 222. With the above arrangement, when looked from the light-emitting area AA to the frame area NA, the second sub-signal line 212 and the third sub-signal line 221 can be isolated by the separation trace 27 between them, when there is a potential difference between them, migrated particles can be gathered on the separation trace 27 between them, to avoid a parasitic capacitance being generated between them due to a potential difference between them; and similarly, the third sub-signal line 221 and the fourth sub-signal line 222 can be isolated by the separation trace 27 between them, which avoids a parasitic capacitance being generated between them due to a potential difference between them, so as to improve the safety performance of the drive substrate 100.

Optionally, when the separation trace 27 is included, the separation trace 27 may be disposed in the same layer as at least one of the first sub-signal line 211, the second sub-signal line 212, the third sub-signal line 221 and the fourth sub-signal line 222, to guarantee the requirement that two adjacent signal lines should be isolated by the separation trace 27.

Figure 14:
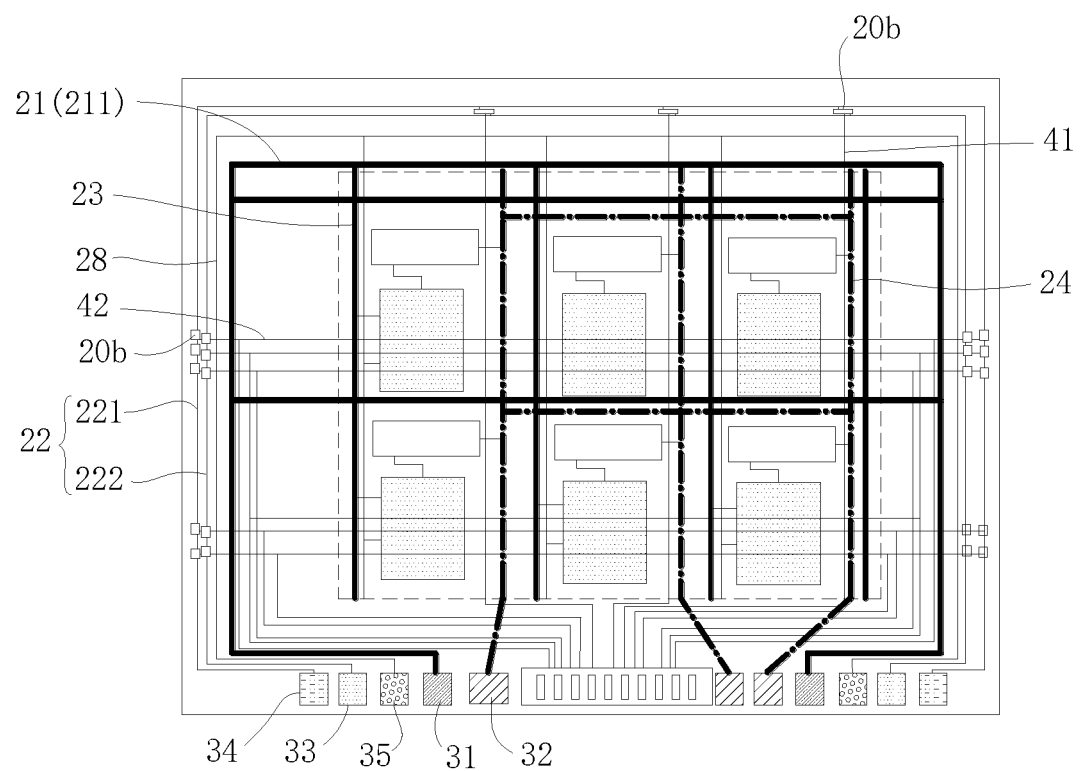
FIG. 14 is a schematic top view of a drive substrate of another embodiment of the present application.

As shown in FIG. 14, as an optional implementation, in the drive substrate 100 provided in the embodiment of the present application, the device layer 20 may further include a scan line 42 and a data line 41 electrically connected to the pixel drive circuit 20a. The electrostatic discharge circuit 20b may include a first electrostatic discharge circuit and a second electrostatic discharge circuit. The scan line 42 may be partially located in the light-emitting area AA and may extend a predetermined length to the frame area NA to be electrically connected to the first electrostatic discharge circuit, and the data line 41 may be located in the light-emitting area AA and may extend a predetermined length to the frame area NA to be electrically connected to the second electrostatic discharge circuit 20b.

Although the scan line 42 and the data line 41, when extending toward the border area NA, may partially overlap with the first sub-signal line 211 and/or the second sub-signal line 212, the bridge is an alternating current (AC) bridge, i.e., all traces being bridged transmit AC signals instead of DC signals with potential differences, and in each frame, each line is turned on only once with a short turn-on time (in a microsecond level), and it is always powered on as long as it is lighted, and therefore the risk of electrochemical corrosion can be reduced greatly.

In some optional embodiments, the parts of the scan line 42 and the data line 41 located in the frame area NA may be formed on the 1$^{st}$ layer 201a of the metal layers, so that there may be more insulation layers 202 above it and the safety performance is better.

It can be understood that, when the drive substrate 100 provided by each of the above-mentioned embodiments of the present application includes the reference signal line 28, that the reference signal line 28 is located in the frame area NA is used as example for illustration, which is an optional implementation.

Figure 15:
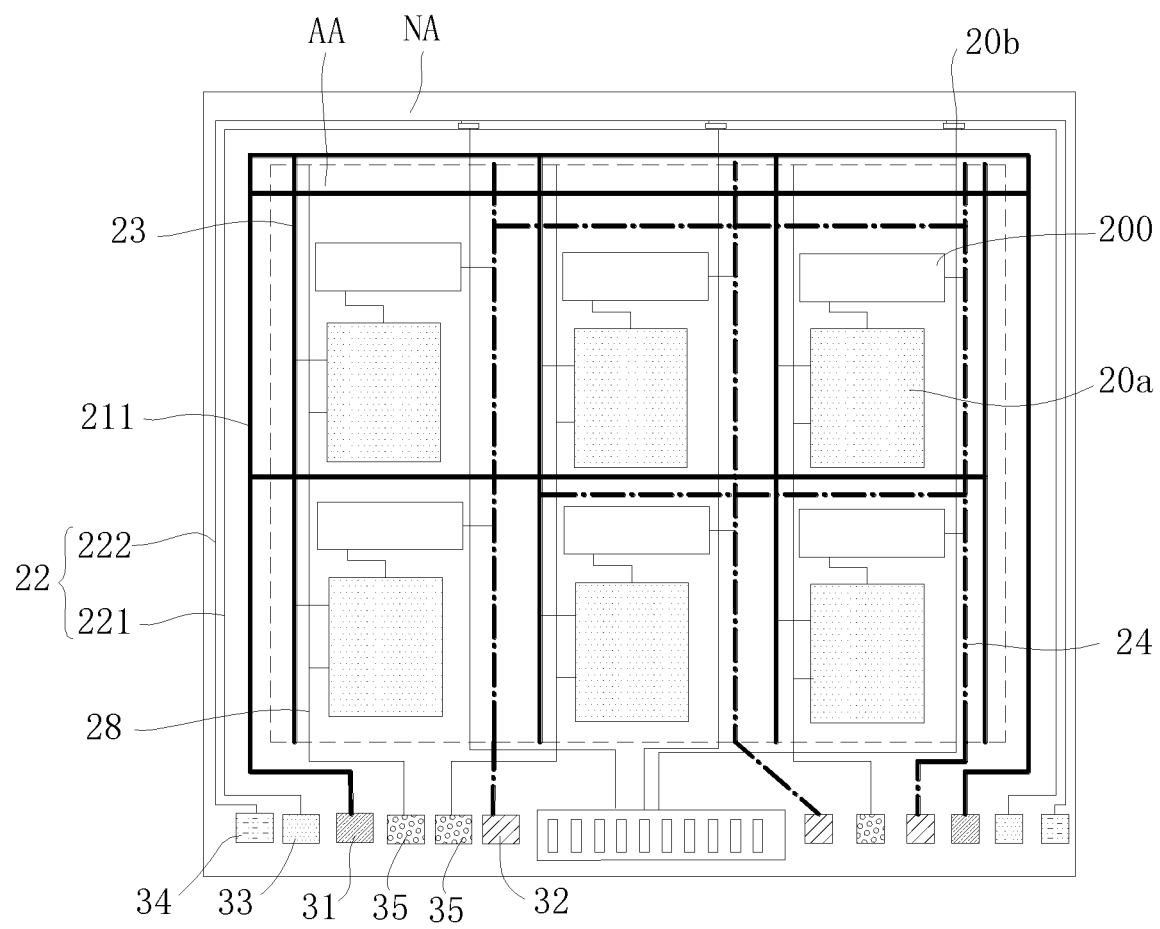
FIG. 15 is a schematic top view of a drive substrate of another embodiment of the present application.

As shown in FIG. 15, in some other embodiments, when the drive substrate 100 provided by the embodiment of the present application includes the reference signal line 28, the reference signal line 28 may be located in the light-emitting area AA and at least partially extend to the frame area NA. The reference signal line 28 may be electrically connected to the pixel drive circuit 20a. In order to provide a reference voltage to the reference signal line 28, the drive substrate 100 provided in the embodiment of the present application may further include a fifth connection terminal 35, and the reference signal line 28 may be electrically connected to the fifth connection terminal 35. Since the reference signal line 28 transmits a fixed potential, with the arrangement that the reference signal line 28 is located in the light-emitting area AA and at least partially extends to the frame area NA to be electrically connected to the pixel drive circuit 20a, a requirement for providing a reference voltage to the pixel drive circuit 20a can be guaranteed, while the reference signal line 28 can be prevented from being bridged with the first signal line 21 or the second signal line 22, and further electrochemical corrosion of the drive substrate 100 in the environments such as high temperature and high humidity etc. can be avoided, and the safety performance of the drive substrate 100 can be guaranteed.

Figure 16:
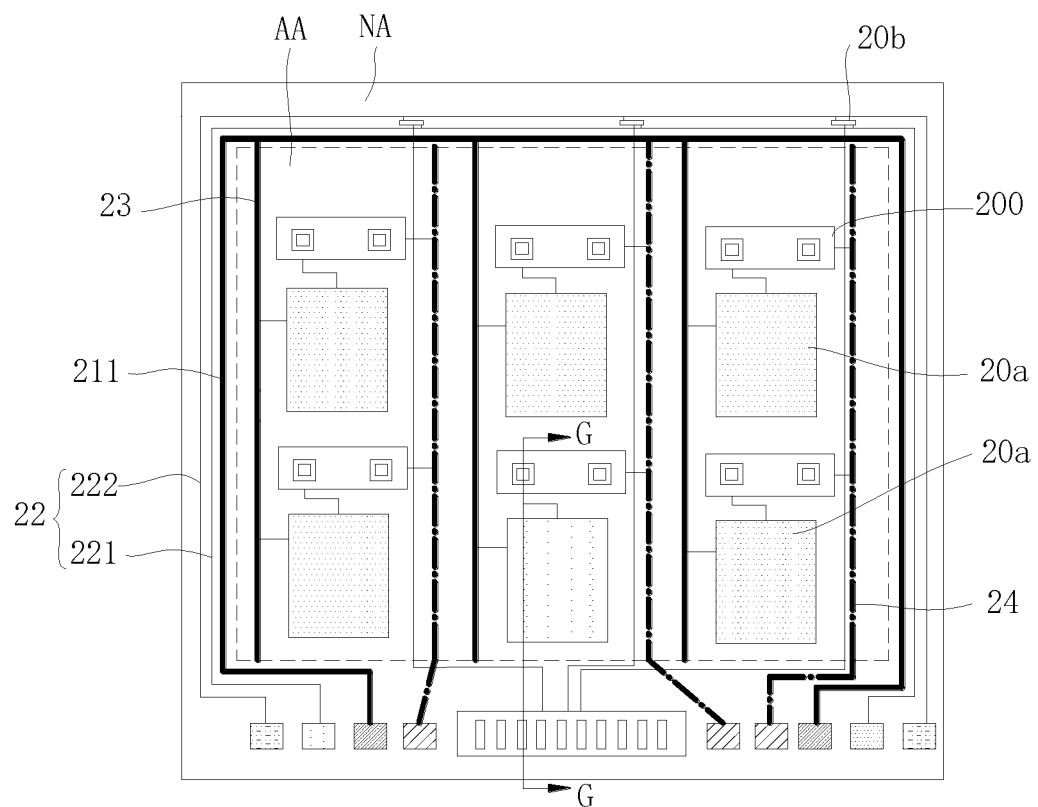
FIG. 16 is a schematic structural diagram of a light-emitting panel of an embodiment of the present application.
Figure 17:
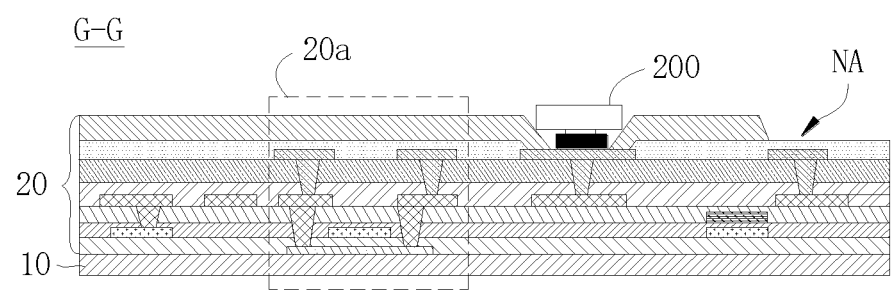
FIG. 17 is a sectional view along a G-G direction in FIG. 16.

As shown in FIG. 16 and FIG. 17, in another aspect, an embodiment of the present application further provides a light-emitting panel, including the above-mentioned drive substrate 100 and a light-emitting layer. The light-emitting layer is stacked on a side of the device layer 20 away from the substrate 10 and is located in the light-emitting area AA. The light-emitting layer includes light-emitting elements distributed in an array and electrically connected to the pixel drive circuit 20a and the first signal line 21.

Since the light-emitting panel provided by the embodiment of the present application includes the drive substrate 100 provided in each of the above-mentioned embodiments, the light-emitting elements 200 can be driven by the drive substrate 100 to meet the lighting requirement. Meanwhile, the second signal line 22 is disposed on the side of the first signal line 21 away from the light-emitting area AA and spaced from the first signal line 21, so that the first signal line 21 can be introduced into the light-emitting area AA directly from the frame area NA and electrically connected to the pixel drive circuit 20a and the light-emitting elements 200, and when introduced into the light-emitting area AA, the first signal line 21 would not be bridged with the second signal line 22, so as to reduce the overlap between them, avoid electrochemical corrosion of the drive substrate 100 in the environments such as high temperature and high humidity etc., and guarantee the safety performance of the drive substrate 100.

Optionally, in the light-emitting panel provided by the embodiment of the present application, the light-emitting elements 200 included in the light-emitting layer may be mini LEDs or micro LEDs, and each light-emitting element 200 may be transferred to the drive substrate 100 by means of transfer, and may be connected to the pixel drive circuit 20a in the device layer 20 by way of binding.

It can be understood that the light-emitting elements 200 are not limited to the mini LEDs or micro LEDs. In some other embodiments, the light-emitting elements 200 can also be OLEDs. When the light-emitting elements 200 are OLEDs, the anodes of the light-emitting elements 200 can be formed after the device layer 20 is formed, so as to be electrically connected to the drive tube of the pixel drive circuit 20a of the device layer 20, after that, light-emitting devices of the OLEDs can be formed, and then the cathode of the light-emitting elements 200 can be formed, the cathode may be a surface electrode and may be electrically connected to the second signal line 22 on the device layer 20 through a via hole, to satisfy the requirement for driving the light-emitting elements 200.

In the light-emitting panel provided by the embodiment of the present application, when the light-emitting elements 200 are mini LEDs, the light-emitting panel can be used as a backlight plate of a liquid crystal display panel; and when the light-emitting elements 200 are OLEDs or micro LEDs, the light-emitting panel can be used as a display panel.

Figure 18:
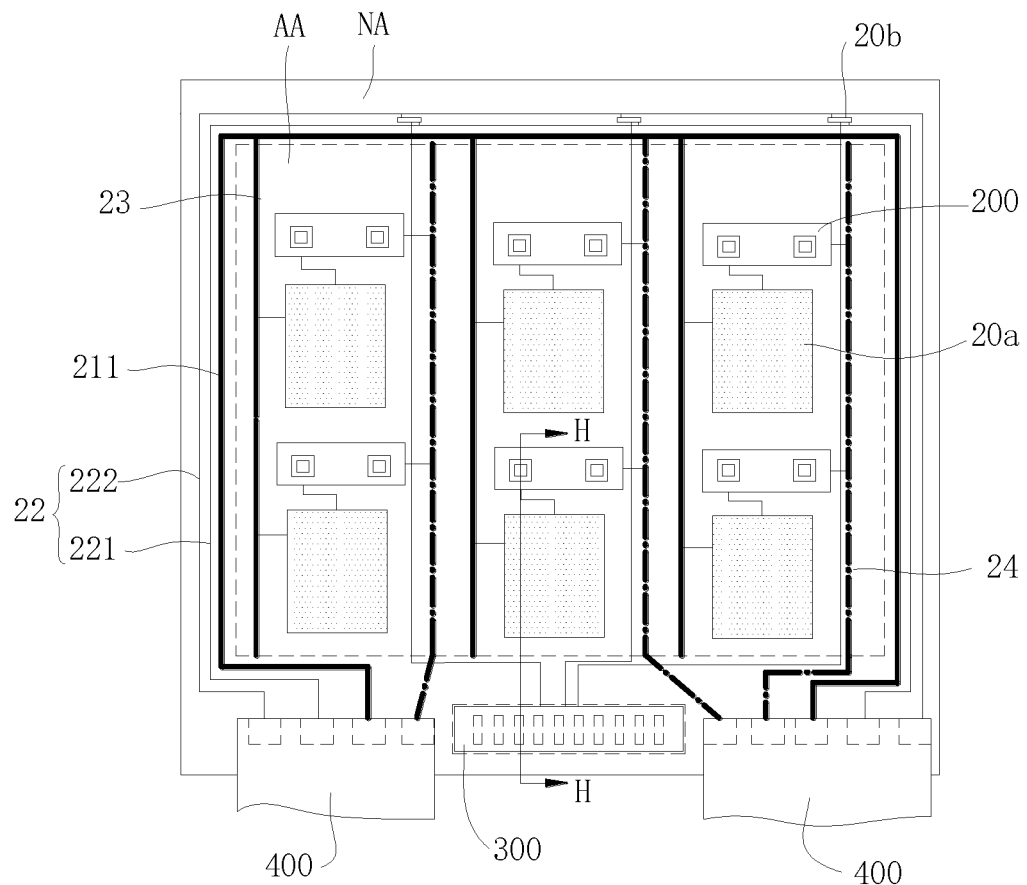
FIG. 18 is a schematic top view of a display device of an embodiment of the present application.
Figure 19:
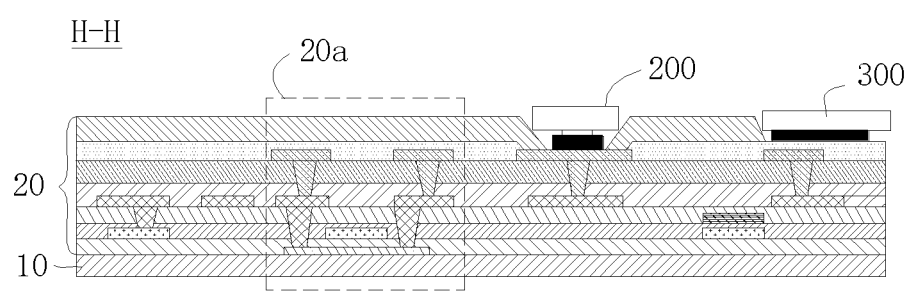
FIG. 19 is a sectional view along an H-H direction in FIG. 18.

As shown in FIG. 18 and FIG. 19, in another aspect, an embodiment of the present application further provides a display device including the light-emitting panel of each of the above-mentioned embodiments, a drive chip 300 and a flexible circuit board 400, and the drive chip 300 is located in the frame area NA. Optionally, the drive chip 300 may be electrically connected to the data line 41 and the scan line 42, so that after the drive chip 300 is bound to the border area NA, a data signal can be provided to the data line 41 and a scan signal can be provided to the scan line 42 through the drive chip 300. Optionally, the flexible circuit board 400 may be bound and electrically connected to respective connection terminals, such as the first connection terminal 31, the second connection terminal 32, the third connection terminal 33, and the fourth connection terminal 34, etc.

Since the display device provided by the embodiment of the present application includes the light-emitting panel provided in each of the above-mentioned embodiments, electrochemical corrosion of the drive substrate 100 in the environments such as high temperature and high humidity etc. can be avoided, and the safety performance is high.

Although the present application has been described with reference to the embodiments, various modifications may be made thereto and components thereof may be replaced with equivalents without departing from the scope of the present application. In particular, as long as there is no structural conflict, various technical features mentioned in various embodiments can be combined in any manner. The present application is not limited to the specific embodiments disclosed herein, and on the contrary, can include all technical solutions that fall within the scope of the claims.

What is claimed is:

1. A drive substrate for driving a light-emitting element, the drive substrate including a light-emitting area and a frame area surrounding at least a part of the light-emitting area, the drive substrate comprising:
   a substrate; and
   a device layer disposed on the substrate, the device layer including a pixel drive circuit disposed in the light-emitting area, and an electrostatic discharge circuit, a first signal line and a second signal line disposed in the frame area, the first signal line being electrically connected to at least one of the pixel drive circuit and the light-emitting element, and the second signal line being directly electrically connected to the electrostatic discharge circuit,
   wherein the second signal line is disposed on a side of the first signal line away from the light-emitting area and is spaced from the first signal line.

2. The drive substrate according to claim 1, wherein a distance between the first signal line and the second signal line is greater than or equal to 3 microns, when looked from the light-emitting area to the frame area.

3. The drive substrate according to claim 1, wherein each of the first signal line and the second signal line includes a power signal line.

4. The drive substrate according to claim 1, wherein the first signal line includes a first sub-signal line electrically connected to one of the pixel drive circuit and the light-emitting element, the second signal line includes a third sub-signal line and a fourth sub-signal line each electrically connected to the electrostatic discharge circuit; when looked from the light-emitting area to the frame area, the third sub-signal line is disposed between the first sub-signal line and the fourth sub-signal line, and the first sub-signal line is disposed on a side of the third sub-signal line facing toward the light-emitting area, the first sub-signal line transmits either of a high-level signal and a low-level signal, and one of the third sub-signal line and the fourth sub-signal line transmits a high-level signal and the other one of third sub-signal line and the fourth sub-signal line transmits a low-level signal.

5. The drive substrate according to claim 4, wherein the first signal line further includes a second sub-signal line electrically connected to the other one of the pixel drive circuit and the light-emitting element; when looked from the light-emitting area to the frame area, the second sub-signal line is disposed between the first sub-signal line and the third sub-signal line, and one of the first sub-signal line and the second sub-signal line transmits a high-level signal and the other one of the first sub-signal line and the second sub-signal line transmits a low-level signal.

6. The drive substrate according to claim 5, wherein each of the second sub-signal line and the third sub-signal line transmits a low-level signal.

7. The drive substrate according to claim 5, wherein the device layer further includes a first signal transfer line and a second signal transfer line, and the first sub-signal line is electrically connected to the pixel drive circuit through the first signal transfer line, the second sub-signal line is electrically connected to the light-emitting element through the second signal transfer line, the second signal transfer line has a first hollow hole provided thereon, and on the substrate, an orthographic projection of the first sub-signal line overlaps with an orthographic projection of the first hollow hole.

8. The drive substrate according to claim 7, wherein the first hollow hole includes a plurality of first hollow holes spaced apart from each other.

9. The drive substrate according to claim 7, wherein the second signal transfer line includes a second connection segment and a second transfer segment connecting the second connection segment and the second sub-signal line, the second signal transfer line is electrically connected to the light-emitting element through the second connection segment, and both the first signal transfer line and the second connection segment are located in the light-emitting area, and the second transfer segment is disposed through the first hollow hole.

10. The drive substrate according to claim 7, wherein the first signal transfer line and the second signal transfer line are at least partially disposed alternately along a same direction, the device layer further includes a first jumper line and a second jumper line, the first jumper line intersects with and is electrically connected to each first signal transfer line, the second jumper line intersects with and is electrically connected to each second signal transfer line, the first signal transfer line has a second hollow hole provided thereon and the second signal transfer line has a third hollow hole provided thereon, and on the substrate, an orthographic projection of the first jumper line overlaps with an orthographic projection of the third hollow hole and an orthographic projection of the second jumper line overlaps with an orthographic projection of the second hollow hole.

11. The drive substrate according to claim 4, wherein the device layer further includes a first signal transfer line and a second signal transfer line, the first sub-signal line is electrically connected to the pixel drive circuit through the first signal transfer line, the first signal transfer line is located in the light-emitting area and is electrically connected to one of the light-emitting element and the pixel drive circuit, the second signal transfer line is located in the light-emitting area and extends at least partially to the frame area, the second signal transfer line is electrically connected to the other one of the light-emitting element and the pixel drive circuit, and on the substrate, an orthographic projection of the second signal transfer line is staggered from an orthographic projection of the first sub-signal line, an orthographic projection of the third sub-signal line, and an orthographic projection of the fourth sub-signal line.

12. The drive substrate according to claim 11, wherein the first signal transfer line and the second signal transfer line are at least partially disposed alternately along a same direction, the device layer further includes a first jumper line and a second jumper line, the first jumper line intersects with and is electrically connected to each first signal transfer line, the second jumper line intersects with and is electrically connected to each second signal transfer line, the first signal transfer line has a second hollow hole provided thereon and the second signal transfer line has a third hollow hole provided thereon, and on the substrate, an orthographic projection of the first jumper line overlaps with an orthographic projection of the third hollow hole and an orthographic projection of the second jumper line overlaps with an orthographic projection of the second hollow hole.

13. The drive substrate according to claim 12, wherein the second hollow hole includes a plurality of second hollow holes spaced apart from each other; or the third hollow hole includes a plurality of third hollow holes spaced apart from each other.

14. The drive substrate according to claim 10, wherein the device layer includes n metal layers stacked in a thickness direction of the substrate and an insulation layer located between every two adjacent metal layers, and in the thickness direction, a 1st layer of the metal layers is located between an nth layer of the metal layers and the substrate, and n is an integer greater than or equal to 2;
wherein the first jumper line and the first signal transfer line are disposed in different layers and connected through a first via hole, and the first jumper line is disposed in the 1st layer of the metal layers; or the second jumper line and the second connection segment are disposed in different layers and connected through a second via hole, and the second jumper line is disposed in the 1st layer of the metal layers.

15. The drive substrate according to claim 5, wherein the device layer further includes a separation trace disposed in the frame area, and when looked from the light-emitting area to the frame area, the separation trace is disposed between the first sub-signal line and the second sub-signal line; or the separation trace is disposed between the second sub-signal line and the third sub-signal line; and
wherein the separation trace is disposed in a same layer as at least one of the first sub-signal line, the second sub-signal line.

16. The drive substrate according to claim 5, wherein the device layer further includes a separation trace disposed in the frame area, and when looked from the light-emitting area to the frame area, the separation trace is disposed between the third sub-signal line and the fourth sub-signal line; and wherein the separation trace is disposed in a same layer as at least one of the third sub-signal line and the fourth sub-signal line.

17. The drive substrate according to claim 1, wherein the device layer further includes a reference signal line disposed in the frame area, the reference signal line is electrically connected to the pixel drive circuit, and when looked from the light-emitting area to the frame area, the reference signal line is disposed between the first signal line and the second signal line.

18. The drive substrate according to claim 1, wherein the device layer further includes a reference signal line located in the light-emitting area and extending at least partially to the frame area, and the reference signal line is electrically connected to the pixel drive circuit.

* * * * *